(12) United States Patent
Tiwari

(10) Patent No.: US 10,540,144 B2
(45) Date of Patent: Jan. 21, 2020

(54) SIGNED DIVISION IN MEMORY

(71) Applicant: Micron Technology, Inc., Boise, ID (US)

(72) Inventor: Sanjay Tiwari, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/055,658

(22) Filed: Aug. 6, 2018

(65) Prior Publication Data

US 2019/0042196 A1 Feb. 7, 2019

Related U.S. Application Data

(63) Continuation of application No. 15/152,266, filed on May 11, 2016, now Pat. No. 10,042,608.

(51) Int. Cl.
*G06F 7/535* (2006.01)
*G11C 7/00* (2006.01)
*G11C 7/06* (2006.01)
*G11C 7/10* (2006.01)
*G11C 11/4091* (2006.01)
(Continued)

(52) U.S. Cl.
CPC ............... *G06F 7/535* (2013.01); *G06F 5/01* (2013.01); *G11C 7/00* (2013.01); *G11C 7/065* (2013.01); *G11C 7/1006* (2013.01); *G11C 11/4076* (2013.01); *G11C 11/4091* (2013.01); *G06F 2205/00* (2013.01); *G06F 2207/535* (2013.01)

(58) Field of Classification Search
CPC ............................ G06F 7/535; G06F 2207/535
USPC ............................................. 708/650, 653–656
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |

(Continued)

FOREIGN PATENT DOCUMENTS

| CN | 102141905 | 8/2011 |
| EP | 0214718 | 3/1987 |

(Continued)

OTHER PUBLICATIONS

D. Efnusheva, et al., A Novel Memory-centric Architecture and Organization of Processors and Computers , Proc. of the 3rd International Conference on Applied Innovations in IT, p. 47-53, 2015 (Year: 2015).*

(Continued)

*Primary Examiner* — Andrew Caldwell
*Assistant Examiner* — Emily E Larocque
(74) *Attorney, Agent, or Firm* — Brooks, Cameron & Huebsch, PLLC

(57) ABSTRACT

Examples of the present disclosure provide apparatuses and methods for performing signed division operations. An apparatus can include a first group of memory cells coupled to a sense line and to a number of first access lines. The apparatus can include a second group of memory cells coupled to the sense line and to a number of second access lines. The apparatus can include a controller configured to operate sensing circuitry to divide a signed dividend element stored in the first group of memory cells by a signed divisor element stored in the second group of memory cells by performing a number of operations.

19 Claims, 16 Drawing Sheets

(51) Int. Cl.
*G06F 5/01* (2006.01)
*G11C 11/4076* (2006.01)

(56) References Cited

U.S. PATENT DOCUMENTS

| | | |
|---|---|---|
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,430,687 A | 7/1995 | Hung et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,953,738 A | 9/1999 | Rao |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,173,305 B1 | 1/2001 | Poland |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazarichuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,058,880 B1 | 6/2006 | Ding et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,532,529 B2 | 5/2009 | Dadashev et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shinano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |

(56) References Cited

U.S. PATENT DOCUMENTS

| | | |
|---|---|---|
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,683,183 B2 | 3/2014 | Sprangle |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,235,414 B2 | 1/2016 | Gopal et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0196030 A1 | 10/2003 | Elliott et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0013442 A1 | 1/2011 | Akerib |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0142419 A1 | 6/2011 | Zou et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0281371 A1 | 9/2014 | Thantry et al. |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0089166 A1 | 3/2015 | Kogge |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |

FOREIGN PATENT DOCUMENTS

| | | |
|---|---|---|
| EP | 2026209 | 2/2009 |
| JP | H0831168 | 2/1996 |
| JP | 2009259193 | 3/2015 |

(56) References Cited

FOREIGN PATENT DOCUMENTS

| | | |
|---|---|---|
| KR | 10-0211482 | 8/1998 |
| KR | 100821616 | 4/2008 |
| KR | 10-2010-0134235 | 12/2010 |
| KR | 10-2013-0049421 | 5/2013 |
| TW | 485601 | 5/2002 |
| TW | 200532708 | 10/2005 |
| TW | 201218070 | 5/2012 |
| TW | 201346724 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

J. Handy, Micron Announces Processor-In-Memory, https://thememoryguy.com/micron-announces-procesor-in-memory/, 2013 (Year: 2013).*

A. Morad, et al., GP-SIMD Processing-in-Memory, ACM Transactions on Architecture and Code Optimization, vol. 11, No. 4, Article 53, Jan. 2015 (Year: 2015).*

Warren Jr., Henry S., "Hacker's Delight", Second Edition, Oct. 2013, pp. 181-184 and 194.

Efnusheva et al., "A Novel Memory-centric Architecture and Organization of Processors and Computers", Mar. 2015, Proceedings of the 3rd International Conference on Applied Innovations in IT (ICAIIT), pp. 47-53.

Morad et al., "GP-SIMD Processing-in-Memory", Jan. 2015, ACM Transactions on Architecture and Code Optimization, vol. 11, No. 4, Article 53, 26 pages.

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

* cited by examiner

| | COMP_COMP (431) | SIGNED_BIT (433) | SIGNED_MASK_A (435) | SIGNED_MASK_B (437) | DIVIDEND (443) | DIVISOR (445) | QUOTIENT (447) | REMAINDER (449) |
|---|---|---|---|---|---|---|---|---|
| 451-1 | 0X00000000 | | | | 0XFFFFFFFF | 0XFFFFFFFF | 0X00000000 | 0X00000000 |
| | | | | | 0X00000000 | 0XFFFFFFFF | 0X00000000 | 0X00000000 |
| | | | | | 0X00000000 | 0X00000000 | 0X00000000 | 0X00000000 |
| | | | | | 0XFFFFFFFF | 0X00000000 | 0X00000000 | 0X00000000 |
| 451-2 | 0X00000000 | 0X00000000 | 0X00000000 | 0X00000000 | 0XFFFFFFFF | 0XFFFFFFFF | 0X00000000 | 0X00000000 |
| | | | | | 0X00000000 | 0XFFFFFFFF | 0X00000000 | 0X00000000 |
| | | | | | 0X00000000 | 0X00000000 | 0X00000000 | 0X00000000 |
| | | | | | 0XFFFFFFFF | 0X00000000 | 0X00000000 | 0X00000000 |
| 451-3 | 0X00000000 | 0X00000000 | 0XFFFFFFFF | 0X00000000 | 0XFFFFFFFF | 0XFFFFFFFF | 0X00000000 | 0X00000000 |
| | | | | | 0X00000000 | 0XFFFFFFFF | 0X00000000 | 0X00000000 |
| | | | | | 0X00000000 | 0X00000000 | 0X00000000 | 0X00000000 |
| | | | | | 0XFFFFFFFF | 0X00000000 | 0X00000000 | 0X00000000 |
| 451-4 | 0X00000000 | 0X00000000 | 0XFFFFFFFF | 0X00000000 | 0XFFFFFFFF | 0XFFFFFFFF | 0X00000000 | 0X00000000 |
| | | | | | 0X00000000 | 0XFFFFFFFF | 0X00000000 | 0X00000000 |
| | | | | | 0X00000000 | 0X00000000 | 0X00000000 | 0X00000000 |
| | | | | | 0XFFFFFFFF | 0X00000000 | 0X00000000 | 0X00000000 |
| 451-5 | 0XFFFFFFFF | 0XFFFFFFFF | 0XFFFFFFFF | 0X00000000 | 0XFFFFFFFF | 0XFFFFFFFF | 0X00000000 | 0X00000000 |
| | | | | | 0X00000000 | 0XFFFFFFFF | 0X00000000 | 0X00000000 |
| | | | | | 0X00000000 | 0X00000000 | 0X00000000 | 0X00000000 |
| | | | | | 0XFFFFFFFF | 0X00000000 | 0X00000000 | 0X00000000 |
| 451-6 | 0X00000000 | 0XFFFFFFFF | 0XFFFFFFFF | 0X00000000 | 0XFFFFFFFF | 0XFFFFFFFF | 0X00000000 | 0X00000000 |
| | | | | | 0XFFFFFFFF | 0XFFFFFFFF | 0X00000000 | 0X00000000 |
| | | | | | 0XFFFFFFFF | 0X00000000 | 0X00000000 | 0X00000000 |
| | | | | | 0X00000000 | 0X00000000 | 0X00000000 | 0X00000000 |
| 451-7 | 0X00000000 | 0XFFFFFFFF | 0XFFFFFFFF | 0X00000000 | 0XFFFFFFFF | 0XFFFFFFFF | 0X00000000 | 0X00000000 |
| | | | | | 0XFFFFFFFF | 0XFFFFFFFF | 0X00000000 | 0X00000000 |
| | | | | | 0XFFFFFFFF | 0X00000000 | 0X00000000 | 0X00000000 |
| | | | | | 0X00000000 | 0X00000000 | 0X00000000 | 0X00000000 |

| | | | | | | |
|---|---|---|---|---|---|---|
| 0X00000000 | 0XFFFFFFFF | 0XFFFFFFFF | 0X00000000 | 0XFFFFFFFF | 0X00000000 | 0XFFFFFFFF |
| | | | 0XFFFFFFFF | 0XFFFFFFFF | 0XFFFFFFFF | 0X00000000 |
| | | | 0XFFFFFFFF | 0X00000000 | 0X00000000 | 0X00000000 |
| | | | 0X00000000 | 0X00000000 | 0X00000000 | 0X00000000 |
| 0XFFFFFFFF | 0XFFFFFFFF | 0X00000000 | 0XFFFFFFFF | 0XFFFFFFFF | 0X00000000 | 0XFFFFFFFF |
| | | | 0XFFFFFFFF | 0XFFFFFFFF | 0XFFFFFFFF | 0X00000000 |
| | | | 0XFFFFFFFF | 0X00000000 | 0XFFFFFFFF | 0X00000000 |
| | | | 0X00000000 | 0X00000000 | 0XFFFFFFFF | 0X00000000 |
| 0XFFFFFFFF | 0XFFFFFFFF | 0X00000000 | 0XFFFFFFFF | 0XFFFFFFFF | 0X00000000 | 0XFFFFFFFF |
| | | | 0X00000000 | 0XFFFFFFFF | 0XFFFFFFFF | 0X00000000 |
| | | | 0X00000000 | 0X00000000 | 0XFFFFFFFF | 0X00000000 |
| | | | 0XFFFFFFFF | 0X00000000 | 0XFFFFFFFF | 0X00000000 |
| 0X00000000 | 0XFFFFFFFF | 0X00000000 | 0XFFFFFFFF | 0XFFFFFFFF | 0X00000000 | 0X00000000 |
| | | | 0X00000000 | 0XFFFFFFFF | 0XFFFFFFFF | 0XFFFFFFFF |
| | | | 0X00000000 | 0XFFFFFFFF | 0XFFFFFFFF | 0X00000000 |
| | | | 0XFFFFFFFF | 0X00000000 | 0XFFFFFFFF | 0XFFFFFFFF |
| 0XFFFFFFFF | 0XFFFFFFFF | 0X00000000 | 0XFFFFFFFF | 0XFFFFFFFF | 0X00000000 | 0XFFFFFFFF |
| | | | 0X00000000 | 0XFFFFFFFF | 0XFFFFFFFF | 0XFFFFFFFF |
| | | | 0X00000000 | 0X00000000 | 0XFFFFFFFF | 0X00000000 |
| | | | 0XFFFFFFFF | 0X00000000 | 0XFFFFFFFF | 0XFFFFFFFF |
| 0XFFFFFFFF | 0XFFFFFFFF | 0X00000000 | 0XFFFFFFFF | 0XFFFFFFFF | 0X00000000 | 0XFFFFFFFF |
| | | | 0X00000000 | 0XFFFFFFFF | 0XFFFFFFFF | 0XFFFFFFFF |
| | | | 0X00000000 | 0X00000000 | 0XFFFFFFFF | 0X00000000 |
| | | | 0XFFFFFFFF | 0X00000000 | 0XFFFFFFFF | 0XFFFFFFFF |

|  | A ⌐438 | B ⌐439 | Q ⌐440 | R ⌐441 |
|---:|:---:|:---:|:---:|:---:|
| 451-8.0 | 0100 | 0010 | 0000 | 0000 |
| 451-8.1 | 0100 | 0010 | 0000 | 0100 |
| 451-8.2.1 | 0100 | 0010 | 0000 | 0100 |
| 451-8.2.1a | 0100 | 0010 | 0000 | 0010 |
| 451-8.2.1b | 0100 | 0010 | 0001 | 0010 |
| 451-8.2.2 | 0100 | 0010 | 0001 | 0010 |
| 451-8.2.2a | 0100 | 0010 | 0001 | 0000 |
| 451-8.2.2b | 0100 | 0010 | 0010 | 0000 |
| 451-8.2.3 | 0100 | 0010 | 0010 | 0000 |

*Fig. 4B*

|  | B' ⌐452 | A ⌐454 | B ⌐456 | C ⌐458 |
|---:|:---:|:---:|:---:|:---:|
|  | 0000 | 0010 | 0010 | 0000 |
| 451-12.1 | 0000 | 0010 | 0010 | 0010 |
| 451-12.2.1a | 0000 | 0010 | 0010 | 0010 |
| 451-12.2.1b | 0000 | 0010 | 0010 | 0010 |
| 451-12.2.2a | 0010 | 0010 | 0010 | 0010 |
| 451-12.2.2b | 0010 | 0010 | 0010 | 0010 |
| 451-12.2.2c | 0010 | 0010 | 0010 | 0100 |
| 451-12.2.3a | 0000 | 0010 | 0010 | 0100 |
| 451-12.2.3b | 0000 | 0010 | 0010 | 0100 |
| 451-12.2.4a | 0000 | 0010 | 0010 | 0100 |
| 451-12.2.4b | 0000 | 0010 | 0010 | 0100 |
| 451-12.3 | 0000 | 0010 | 0010 | 0100 |

*Fig. 4C*

|         | 462 CARRY | 464 A | 466 B | 468 C |
|---------|-------|------|------|------|
| 453-0   | 0000  | 0010 | 0001 | 0000 |
| 453-1.2 | 0000  | 0010 | 0001 | 0001 |
| 453-1.1a| 0000  | 0010 | 0001 | 0001 |
| 453-1.2 | 0000  | 0010 | 0001 | 0011 |
| 453-1.2a| 0000  | 0010 | 0001 | 0011 |
| 453-1.3 | 0000  | 0010 | 0001 | 0011 |
| 453-1.3a| 0000  | 0010 | 0001 | 0011 |
| 453-1.4 | 0000  | 0010 | 0001 | 0011 |
| 453-1.4a| 0000  | 0010 | 0001 | 0011 |

*Fig. 4D*

|           | 471 CARRY | 472 B' | 474 A | 476 B | 478 C |
|-----------|-------|------|------|------|------|
| 455-0     | 0000  | 0000 | 0010 | 0001 | 0000 |
| 455-1     | 0000  | 1111 | 0010 | 0001 | 0000 |
| 455-2     | 0000  | 1111 | 0010 | 0001 | 1101 |
| 455-3     | 0010  | 1111 | 0010 | 0001 | 1101 |
| 455-3.1a  | 0100  | 1111 | 0010 | 0001 | 1101 |
| 455-3.1b  | 0100  | 1111 | 0010 | 0001 | 1001 |
| 455-3.2a  | 1000  | 1111 | 0010 | 0001 | 1001 |
| 455-3.2b  | 1000  | 1111 | 0010 | 0001 | 0001 |
| 455-3.3a  | 0000  | 1111 | 0010 | 0001 | 0001 |
| 455-3.3b  | 0000  | 1111 | 0010 | 0001 | 0001 |

*Fig. 4E*

| A | B | NOT OPEN | OPEN TRUE | OPEN INVERT |
|---|---|---|---|---|
| 0 | 0 | 0 | 0 | 1 |
| 0 | 1 | 0 | 1 | 0 |
| 1 | 0 | 1 | 0 | 1 |
| 1 | 1 | 1 | 1 | 0 |

844, 845, 856, 870, 871

875 ⟶ ⋈

| | FF | 0 | 0 | 0 | 0 | 0 | 0 | 1 | 1 | 1 | ← 876 |
| | FT | 0 | 0 | 0 | 1 | 1 | 1 | 0 | 0 | 0 | ← 877 |
| | TF | 0 | 0 | 1 | 0 | 0 | 1 | 0 | 0 | 1 | ← 878 |
| | TT | 0 | 1 | 0 | 0 | 1 | 0 | 0 | 1 | 0 | ← 879 |
| A | B | A | A*B | A*B̄ | A+B | B | AXB | A+B̄ | ĀXB | B̄ | ← 847 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

880 brackets rows 876-879

*Fig. 8*

SIGNED DIVISION IN MEMORY

PRIORITY INFORMATION

This application is a Continuation of U.S. application Ser. No. 15/152,266, filed May 11, 2016, which issues as U.S. Pat. No. 10,042,608 on Aug. 7, 2018, the contents of which are included herein by reference.

TECHNICAL FIELD

The present disclosure relates generally to semiconductor memory apparatuses and methods, and more particularly, to apparatuses and methods related to performing signed division operations in memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIGS. 4A to 4E each illustrate tables showing the states of memory cells of an array at a particular phase associated with performing a signed division operation in accordance with a number of embodiments of the present disclosure.

FIG. 8 is a logic table illustrating selectable logic operation results implemented by a sensing circuitry in accordance with a number of embodiments of the present disclosure.

DETAILED DESCRIPTION

The present disclosure includes apparatuses and methods related to signed division operations in memory. The apparatuses can include a first group of memory cells coupled to a sense line and to a number of first access lines and a second group of memory cells coupled to the sense line and to a number of second access lines. The apparatuses can include a controller configured to operate sensing circuitry to divide a signed dividend element stored in the first group of memory cells by a signed divisor element stored in the second group of memory cells. The apparatus can be configured to divide the signed dividend element by the signed divisor element by performing a number of operations.

Figure 3:
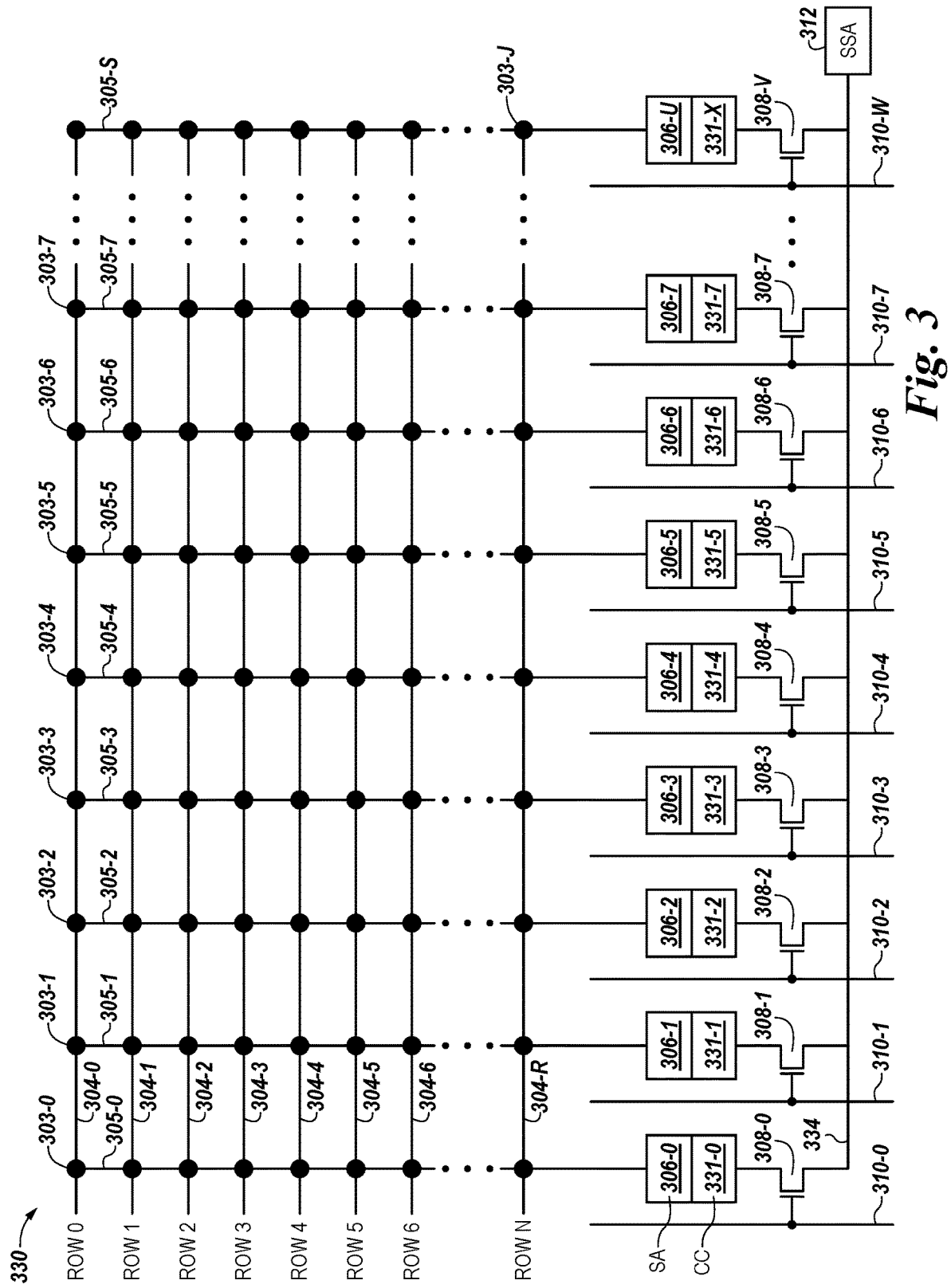
FIG. 3 illustrates a schematic diagram of a portion of a memory array in accordance with a number of embodiments of the present disclosure.

A signed division operation can include using a first group of memory cells coupled to a sense line (e.g., 305-0 in FIG. 3) and a number of first access lines (e.g., ROW 0 to ROW 3 in FIG. 3) and a second group of memory cells coupled to the sense line (e.g., 305-0 in FIG. 3) and a number of second access lines (e.g., ROW 4 to ROW 7 in FIG. 3). The signed division operation can include using a controller configured to operate sensing circuitry to divide a signed dividend element stored in the first group of memory cells (e.g., arranged vertically in the array, as illustrated) by a signed divisor element stored in the second group of memory cells (e.g., arranged vertically in the array, as illustrated) by performing a number of operations without transferring data via an input/output (I/O) line.

A signed division operation can be performed by dividing bit-vectors of a particular sign (e.g., positive or negative). For example, a signed division operation can include dividing a first vector with signed elements by a second vector with signed elements. The first vector can represent a number of signed dividends and be stored in a group of memory cells coupled to a first sense line and to a number of access lines of a memory array. The second vector can represent a number of signed divisors and be stored in a group of memory cells coupled to a second sense line and to the number of access lines of the memory array. The signed division operation can include a number of AND operations, OR operations, SHIFT operations, and INVERT operations performed without transferring data via an input/output (I/O) line.

As used herein, a vector (e.g., a bit-vector) can include a number (e.g., one or more) of elements. As used herein, the term "bit vector" is intended to mean a physically contiguous number of bits on a bit vector memory device, e.g., Processing In Memory (PIM) device, whether physically contiguous in rows (e.g., horizontally oriented) or columns (e.g., vertically oriented) in an array of memory cells. Thus, as used herein an operation on a bit vector can be intended to mean an operation that is performed on a bit-vector that is a contiguous portion of virtual address space, e.g., used by a PIM device. For example, a virtual address space may have a bit length of 256 bits. A portion of the virtual address space may or may not be contiguous physically to other portions in the virtual address space.

An element can, in a number of embodiments, be a numerical value that can be stored in memory as a bit-vector. A plurality of elements can, in a number of embodiments, be a number of numerical values stored in memory as a bit-vector. The element can be a numerical value that includes a particular sign. For example, the numerical value can be a positive value or the numerical value can be a negative value and therefore be a "signed" value. The signed value of an element can be indicated by a particular data value (e.g., a bit value of "1" indicating a negative value and a bit value of "0" indicating a positive value). Refer to FIG. 4A for further description of an indication of a signed value.

A first element (e.g., a first operand) having a first signed (e.g., positive) value and stored as a first bit-vector can be stored in a number of memory cells coupled to a sense line and to a number of access lines (e.g., illustrated vertically and/or in a column in examples) in the memory array. A second element (e.g., a second operand) having a second signed (e.g., positive) value and stored as a second bit-vector can be stored in an additional number of memory cells coupled to an additional sense line and to the number of access lines (e.g., illustrated vertically and/or in a different column in examples) of the memory array. An unsigned value can refer to a value that does not include an indication regarding its sign. As an example, an unsigned value may be assumed to be a positive value.

A number of embodiments of the present disclosure can provide a reduction of the number of computations and/or time involved in performing a number of signed division operations (e.g., signed division functions) relative to previous approaches. For instance, the number of computations and/or the time can be reduced due to an ability to perform various portions of the number of signed division operations in parallel (e.g., simultaneously). Performing a number of signed division operations as described herein can also reduce power consumption as compared to previous approaches. In accordance with a number of embodiments, a signed division operation can be performed on elements (e.g., data in the form of bit-vectors stored in an array) without transferring data out of the memory array and/or sensing circuitry via a bus (e.g., data bus, address bus, control bus, etc.). A signed division operation can involve performing a number of operations (e.g., AND operations, OR operations, SHIFT operations, INVERT operations, and Block_OR operations, etc.). However, embodiments are not limited to these examples.

In various previous approaches, elements (e.g., a first value and a second value) to be divided may have been transferred from the array and sensing circuitry to a number of registers via a bus comprising input/output (I/O) lines, for instance. The number of registers can be used by a processing resource such as a processor, microprocessor, and/or compute engine, which may comprise ALU circuitry and/or other functional unit circuitry configured to perform the appropriate logical operations. However, often only a single division function can be performed by the ALU circuitry, and transferring data to/from memory from/to registers via a bus can involve significant power consumption and time requirements. Even if the processing resource is located on a same chip as the memory array, significant power can be consumed in moving data out of the array to the compute circuitry (e.g., ALU). For instance, moving the data from the memory array to the processing resource can include performing a sense line address access (e.g., firing of a column decode signal) in order to transfer data from sense lines onto I/O lines, moving the data to the array periphery, and providing the data to a register in association with performing a signed division operation, for instance.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example.

In contrast, in a number of embodiments of the present disclosure, the sensing circuitry (e.g., 150) can be formed on a same pitch as a pair of complementary sense lines. As an example, memory cells coupled to the pair of complementary sense lines may have a cell size of $6F^2$ (e.g., $3F \times 2F$), with the complementary sense lines having a 3F pitch. In this example, the sensing circuitry being on pitch with the complementary sense line pairs and/or on pitch with the memory cells indicates the sensing circuitry (e.g., a sense amplifier and corresponding compute component per respective pair of complementary sense lines) is formed to fit within the 3F pitch of the complementary sense lines.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "S," "T," "U," "V," "W," etc., particularly with respect to reference numerals in the drawings, indicates that a number of the particular feature so designated can be included. As used herein, "a number of"

a particular thing can refer to one or more of such things (e.g., a number of memory arrays can refer to one or more memory arrays).

Figure 1:
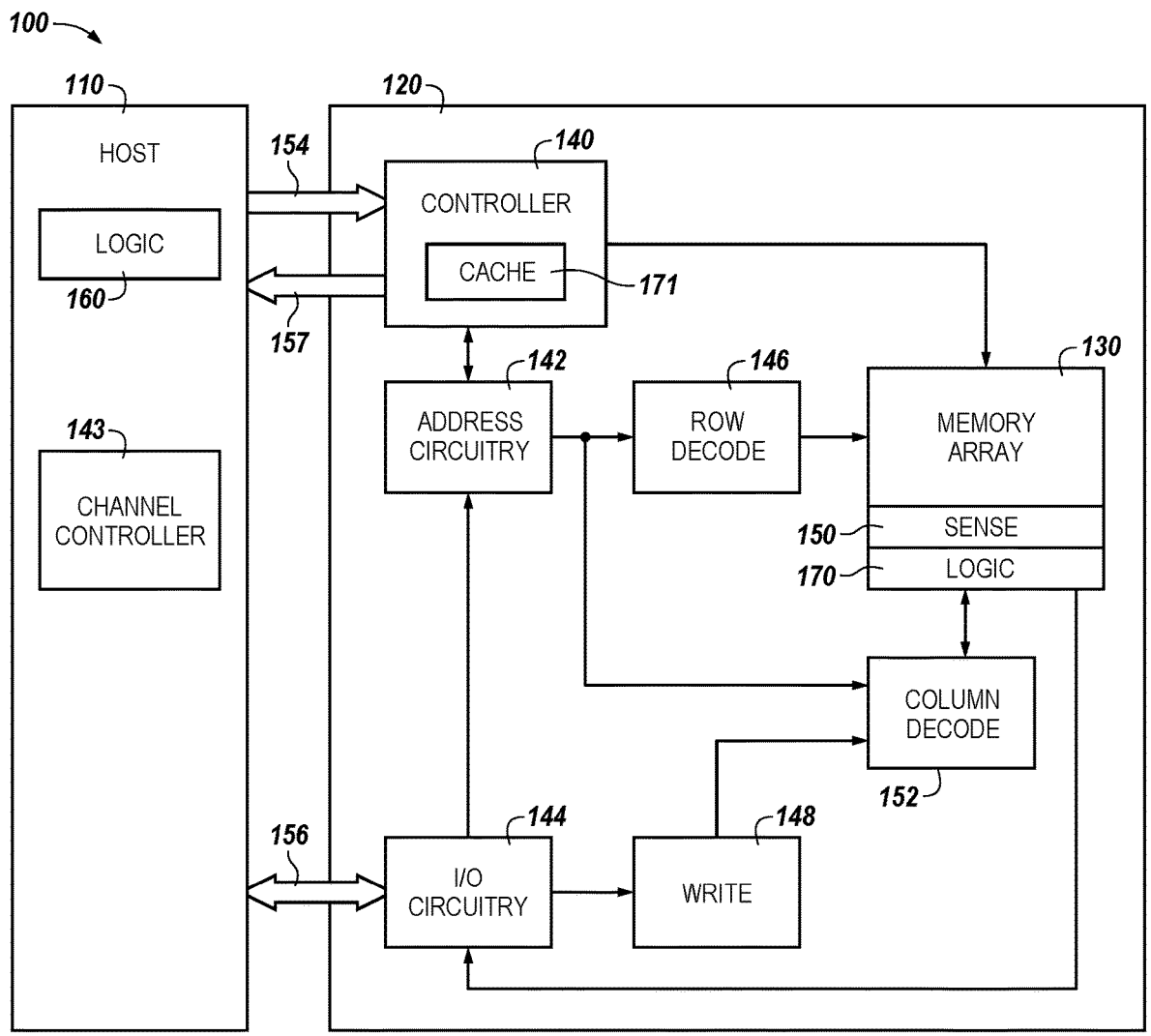
FIG. 1 is a block diagram of an apparatus in the form of a computing system including a memory device in accordance with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2A, and a similar element may be referenced as 331 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, and logic circuitry 170 might also be separately considered an "apparatus."

In this example, system 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a bus 156 (e.g., an I/O bus) through I/O circuitry 144. Status and/or exception information can be provided from the controller 140 on the memory device 120 to a channel controller 143 (e.g., via a high speed interface (HSI) that can include an out-of-band bus 157. Address signals are received through address circuitry 142 and decoded by a row decoder 146 and a column decoder 152 to access the memory array 130. The address signals can also be provided to controller 140 (e.g., via address circuitry 142 and/or via a control bus 154). Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130. Cache 171 can be used to store data associated with the controller 140.

Controller 140, which may be referred to as bank control logic and/or a sequencer, decodes signals provided by control bus 154 from the host 110 and/or channel controller 143. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, a sequencer, or some other type of controller. The controller 140 can control shifting data (e.g., right or left) in an array (e.g., memory array 130), as well as signed division data in accordance with a number of embodiments described herein.

Examples of the sensing circuitry 150 can comprise a number of sensing components that each may comprise a sense amplifier and a corresponding compute component, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various operations (e.g., a number of logical operations that may be performed as part of a compute function, such as a function for determining a result of a mathematical computation), can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer), results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, sensing circuitry (e.g., 150) can be used to perform logical operations without enabling column decode lines of the array; however, the local I/O line(s) may be enabled in order to transfer a result to a suitable location other than back to the array 130 (e.g., to an external register).

Figure 2A:
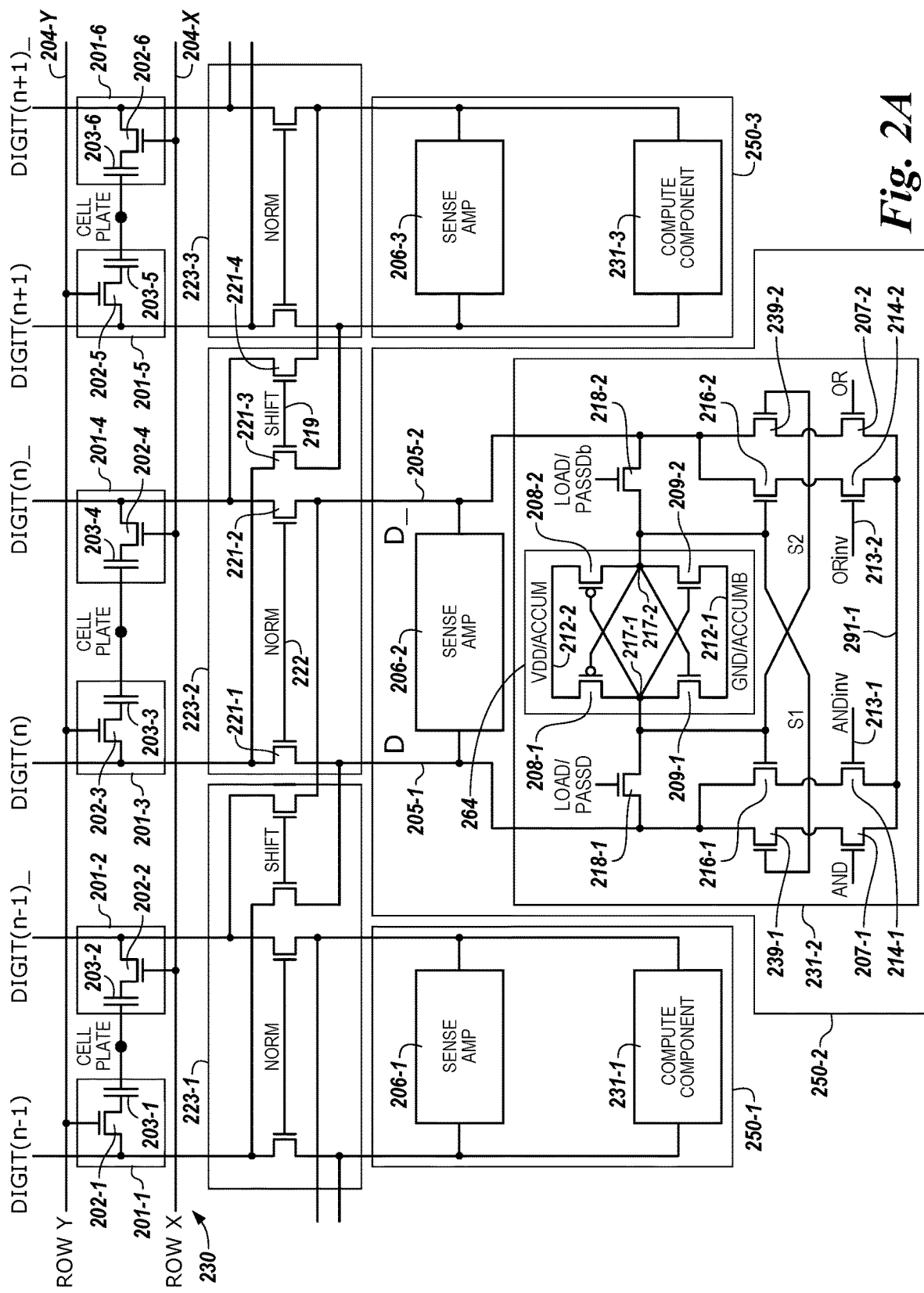
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. A memory cell (e.g., one of memory cells 201-1, 201-2, 201-3, 201-4, 201-5, 201-6) comprises a storage element (e.g., one of corresponding capacitors 203-1 to 203-6) and an access device (e.g., one of corresponding transistors 202-1 to 202-6). For instance, memory cell 201-3 comprises transistor 202-3 and capacitor 203-3 memory cell 201-4 comprises transistor 202-4 and capacitor 203-4, memory cell 201-3 comprises transistor 202-3 and capacitor 203-3, and memory cell 201-4 comprises transistor 202-4 and capacitor 203-4, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-X (Row X), 204-Y (Row Y), etc., and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. The pair of complementarity data lines can be referred to as a column. For instance, referring to a column can refer to complementary sense lines such as D 205-1 and D_ 205-2 being included when referring to a "column." Although only three pair of complementary data lines are shown in FIG. 2A (e.g., three "columns"), embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-3 can be coupled to data line 205-1 (D), a second source/drain region of transistor 202-3 can be coupled to capacitor 203-3, and a gate of a transistor 202-3 can be coupled to word line 204-Y. A first source/drain region of a transistor 202-4 can be coupled to data line 205-2 (D_), a second source/drain region of transistor 202-4 can be coupled to capacitor 203-4, and a gate of a transistor 202-4 can be coupled to word line 204-X. The cell plate, as shown in FIG. 2A, can be coupled to each of capacitors 203-3 and 203-4. The cell plate can be a common node to which a reference voltage (e.g., ground) can be applied in various memory array configurations.

The memory array 230 is coupled to sensing circuitry comprising a number of sensing components 250-1, 250-2, 250-3, etc., in accordance with a number of embodiments of the present disclosure. Each sensing component comprises a sense amplifier and a corresponding compute component corresponding to respective columns of memory cells (e.g., coupled to respective pairs of complementary data lines). The sensing circuitry can comprise a number of elements, but it at least includes a sense amp and corresponding compute component per column (e.g., the two complementary sense lines in reference to a column) of the array. In this example, the sensing circuitry 250-1 comprises a sense amplifier 206-1 and a compute component 231-1 corresponding to respective columns of memory cells (e.g., memory cells 201-1 and 201-2 coupled to respective pairs of complementary data lines). Sensing circuitry 250-2 comprises a sense amplifier 206-2 and a compute component 231-2 corresponding to respective columns of memory cells (e.g., memory cells 201-3 and 201-4 coupled to respective pairs of complementary data lines). Sensing circuitry 250-3 comprises a sense amplifier 206-3 and a compute component 231-3 corresponding to respective columns of memory cells (e.g., memory cells 201-5 and 201-6 coupled to respective pairs of complementary data lines). A sense amplifier (e.g., sense amplifier 206-1) can comprise a cross coupled latch, which can be referred to herein as a primary latch. The sense amplifier (e.g., sense amplifier 206-1) can be configured, for example, as described with respect to FIG. 2B. The compute components of array 230 can be referred to generally as compute components 231 and the sense amplifiers of array 230 can be referred to generally as sense amplifiers 206.

In the example illustrated in FIG. 2A, the circuitry corresponding to compute component 231-2 comprises a static latch 264 and an additional number of (e.g., ten) transistors that implement, among other things, a dynamic latch. For ease of reference, compute component 231-2 has been illustrated in an expanded format to describe the functioning of the compute component. Additional compute components (e.g., compute components 231-1 and 231-3) include elements of the expanded format of compute component 231-2 but are not illustrated in FIG. 2A. The dynamic latch and/or static latch 264 of the compute components 231 can be referred to herein as a secondary latch, which can serve as an accumulator. As such, the compute components 231 can operate as and/or be referred to herein as an accumulator. Each of the compute components 231 can be coupled to a pair of complementary data lines (e.g, D 205-1 and D_ 205-2) as shown in FIG. 2A. The transistors of compute components (e.g., 231-2) can all be n-channel transistors (e.g., NMOS transistors), for example. However, embodiments are not limited to this example.

In this example, data line D 205-1 is coupled to a first source/drain region of transistors 216-1 and 239-1, as well as to a first source/drain region of load/pass transistor 218-1. Data line D_ 205-2 is coupled to a first source/drain region of transistors 216-2 and 239-2, as well as to a first source/drain region of load/pass transistor 218-2.

The gates of load/pass transistor 218-1 and 218-2 are commonly coupled to a LOAD control signal, or respectively coupled to a PASSD/PASSDB control signal, as discussed further below. A second source/drain region of load/pass transistor 218-1 is directly coupled to the gates of transistors 216-1 and 239-2. A second source/drain region of load/pass transistor 218-2 is directly coupled to the gates of transistors 216-2 and 239-1.

A second source/drain region of transistor 216-1 is directly coupled to a first source/drain region of pull-down transistor 214-1. A second source/drain region of transistor 239-1 is directly coupled to a first source/drain region of pull-down transistor 207-1. A second source/drain region of transistor 216-2 is directly coupled to a first source/drain region of pull-down transistor 214-2. A second source/drain region of transistor 239-2 is directly coupled to a first source/drain region of pull-down transistor 207-2. A second source/drain region of each of pull-down transistors 207-1, 207-2, 214-1, and 214-2 is commonly coupled together to a reference voltage (e.g., ground (GND) 291-1). A gate of pull-down transistor 207-1 is coupled to an AND control signal line, a gate of pull-down transistor 214-1 is coupled to an ANDinv control signal line 213-1, a gate of pull-down transistor 214-2 is coupled to an ORinv control signal line 213-2, and a gate of pull-down transistor 207-2 is coupled to an OR control signal line.

The gate of transistor 239-1 can be referred to as node S1, and the gate of transistor 239-2 can be referred to as node S2. The circuit shown in FIG. 2A stores accumulator data dynamically on nodes S1 and S2. Activating a LOAD control signal causes load/pass transistors 218-1 and 218-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 2A is not contingent on the LOAD control signal being elevated to a voltage greater than $V_{DD}$.

The configuration of compute component 231-2 shown in FIG. 2A has the benefit of balancing the sense amplifier for functionality when the pull-down transistors 207-1, 207-2, 214-1, and 214-2 are conducting before the sense amplifier 206-2 is fired (e.g., during pre-seeding of the sense amplifier 206-2). As used herein, firing the sense amplifier 206-2 refers to enabling the sense amplifier 206-2 to set the primary latch and subsequently disabling the sense amplifier 206-2 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 216-1 (having a gate coupled to S2 of the dynamic latch) in series with transistor 214-1 (having a gate coupled to an ANDinv control signal line 213-1) can be operated to pull-down data line 205-1 (D), and transistor 216-2 (having a gate coupled to S1 of the dynamic latch) in series with transistor 214-2 (having a gate coupled to an ORinv control signal line 213-2) can be operated to pull-down data line 205-2 (D_).

The latch 264 can be controllably enabled by coupling to an active negative control signal line 212-1 (ACCUMB) and an active positive control signal line 212-2 (ACCUM) rather than be configured to be continuously enabled by coupling to ground and $V_{DD}$. In various embodiments, load/pass transistors 208-1 and 208-2 can each have a gate coupled to one of a LOAD control signal or a PASSD/PASSDB control signal.

According to some embodiments, the gates of load/pass transistors 218-1 and 218-2 can be commonly coupled to a LOAD control signal. In the configuration where the gates of load/pass transistors 218-1 and 218-2 are commonly coupled to the LOAD control signal, transistors 218-1 and 218-2 can be load transistors.

According to some embodiments, the gate of load/pass transistor 218-1 can be coupled to a PASSD control signal, and the gate of load/pass transistor 218-2 can be coupled to a PASSDB control signal. In the configuration where the gates of transistors 218-1 and 218-2 are respectively coupled to one of the PASSD and PASSDB control signals, transistors 218-1 and 218-2 can be pass transistors. Pass transistors can be operated differently (e.g., at different times and/or under different voltage/current conditions) than load transistors. As such, the configuration of pass transistors can be different than the configuration of load transistors. As used herein, configuration is intended to mean size, doping level, and transition type.

Load transistors can be configured (e.g., can be sized, doped, etc.) to handle loading specifications associated with coupling data lines to the local dynamic nodes S1 and S2, for example. Pass transistors, however, can be configured to handle heavier loading associated with coupling data lines to an adjacent accumulator (e.g., through the adjacent compute component 231-3 and shift circuitry 223-2 in memory array 230, as shown in FIG. 2A). According to some embodiments, load/pass transistors 218-1 and 218-2 can be configured to accommodate the heavier loading corresponding to a pass transistor but be coupled and operated as a load transistor. For example, load/pass transistors 218-1 and 218-2 configured as pass transistors can also be utilized as load transistors. However, load/pass transistors 218-1 and 218-2 configured as load transistors may not be capable of being utilized as pass transistors.

In a number of embodiments, the compute components (e.g., 231-2, including the latch 264) can comprise a number of transistors formed on pitch with the transistors of the corresponding memory cells of an array (e.g., array 230 shown in FIG. 2A) to which they are coupled, which may conform to a particular feature size (e.g., $4F^2$, $6F^2$, etc.). According to various embodiments, latch 264 can include four transistors 208-1, 208-2, 209-1, and 209-2 coupled to a pair of complementary data lines D 205-1 and D_ 205-2 through load/pass transistors 218-1 and 218-2. However, embodiments are not limited to this configuration. The latch 264 can be a cross coupled latch. For instance, the gates of a pair of transistors, such as n-channel transistors (e.g., NMOS transistors) 209-1 and 209-2 are cross coupled with the gates of another pair of transistors, such as p-channel transistors (e.g., PMOS transistors) 208-1 and 208-2. As described further herein, the cross coupled latch 264 can be referred to as a static latch.

The voltages or currents on the respective data lines D and D_ can be provided to the respective latch inputs 217-1 and 217-2 of the cross coupled latch 264 (e.g., the input of the secondary latch). In this example, the latch input 217-1 is coupled to a first source/drain region of transistors 208-1 and 209-1 as well as to the gates of transistors 208-2 and 209-2. Similarly, the latch input 217-2 can be coupled to a first source/drain region of transistors 208-2 and 209-2 as well as to the gates of transistors 208-1 and 209-1.

Figure 2B:
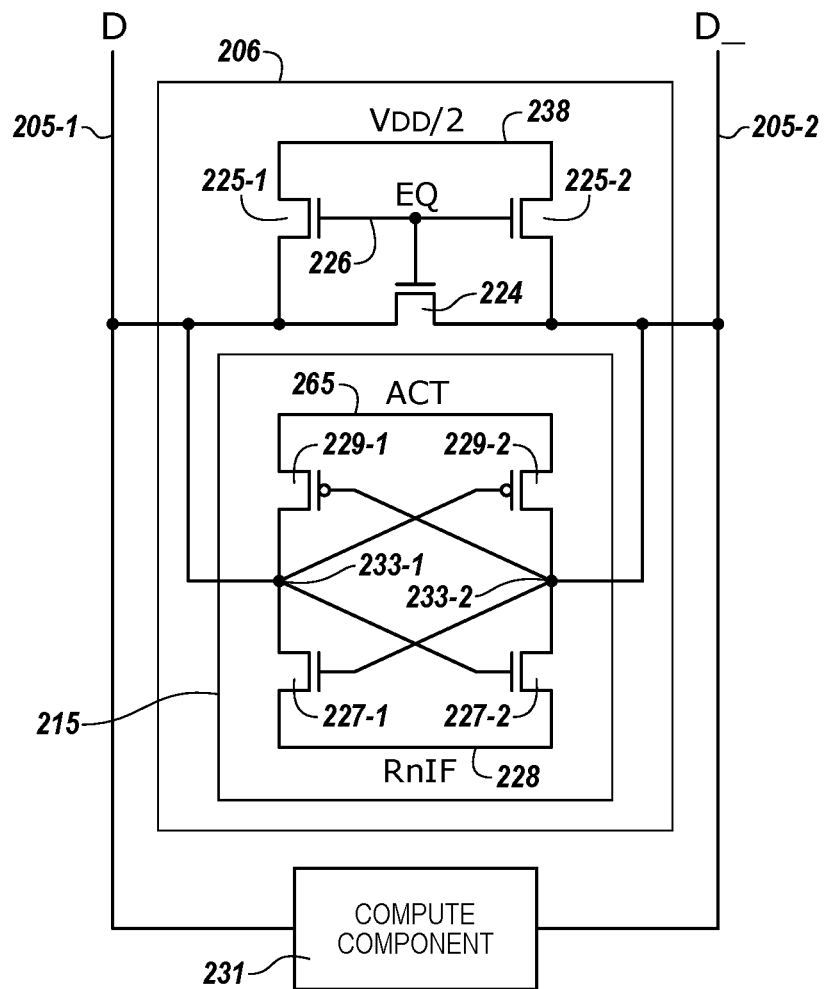
FIG. 2B is a schematic diagram illustrating a portion of sensing circuitry in accordance with a number of embodiments of the present disclosure.

In this example, a second source/drain region of transistor 209-1 and 209-2 is commonly coupled to a negative control signal line 212-1 (e.g., ground (GND) or ACCUMB control signal similar to control signal RnIF shown in FIG. 2B with respect to the primary latch). A second source/drain region of transistors 208-1 and 208-2 is commonly coupled to a positive control signal line 212-2 (e.g., $V_{DD}$ or ACCUM control signal similar to control signal ACT shown in FIG. 2B with respect to the primary latch). The positive control signal 212-2 can provide a supply voltage (e.g., $V_{DD}$) and the negative control signal 212-1 can be a reference voltage (e.g., ground) to enable the cross coupled latch 264. According to some embodiments, the second source/drain region of transistors 208-1 and 208-2 are commonly coupled directly to the supply voltage (e.g., $V_{DD}$), and the second source/drain region of transistor 209-1 and 209-2 are commonly coupled directly to the reference voltage (e.g., ground) so as to continuously enable latch 264.

The enabled cross coupled latch 264 operates to amplify a differential voltage between latch input 217-1 (e.g., first common node) and latch input 217-2 (e.g., second common node) such that latch input 217-1 is driven to either the activated positive control signal voltage (e.g., $V_{DD}$) or the activated negative control signal voltage (e.g., ground), and latch input 217-2 is driven to the other of the activated positive control signal voltage (e.g., $V_{DD}$) or the activated negative control signal voltage (e.g., ground).

As shown in FIG. 2A, the sense amplifier 206-2 and the compute component 231-2 can be coupled to the array 230 via shift circuitry 223-2. In some examples, the sensing circuitry can include shifting circuitry, such as shifting circuitry 223-1, 223-2, and 223-3, as shown in FIG. 2A and referred to generally as shifting circuitry 223. In this example, the shift circuitry 223 comprises a pair of isolation devices coupled to respective data lines of a complementary data line pair (e.g., isolation transistors 221-1 and 221-2 of shifting circuitry 223-2 are coupled to data lines 205-1 (D) and 205-2 (D_), respectively). In this example, the isolation transistors (e.g., 221-1 and 221-2) are coupled to a control signal 222 (NORM) that, when activated, enables (e.g., turns on) the isolation transistors 221-1 and 221-2 to couple the corresponding sense amplifier 206-2 and compute component 231-2 to a corresponding column of memory cells (e.g., to a corresponding pair of complementary data lines 205-1 (D) and 205-2 (D_), and compute component 231-6 corresponding to DIGIT(n−1) and DIGIT(n−1)_ illustrated on the left complementary pair of sense lines and compute component 231-6 corresponding to DIGIT (n+1) and DIGIT(n+1)_ illustrated on the right complementary pair of sense lines). According to various embodiments, conduction of the isolation transistors (e.g., 221-1 and 221-2) can be referred to as a "normal" configuration of the shift circuitry 223.

In the example illustrated in FIG. 2A, the shift circuitry 223 includes another (e.g., a second) pair of isolation devices coupled to a complementary control signal (e.g., shift circuitry 223-2 includes isolation transistors 221-3 and 221-4 coupled to complementary control signal 219 (SHIFT)), which can be activated, for example, when NORM 222 is deactivated. The isolation transistors (e.g., 221-3 and 221-4) can be operated (e.g., via control signal 219) such that a particular sense amplifier (e.g., 206-2) and compute component (e.g., 231-2) are coupled to a different pair of complementary data lines (e.g., a pair of complementary data lines different than the pair of complementary data lines to which isolation transistors 221-1 and 221-2 couple the particular sense amplifier 206-2 and compute component 231-2), or can couple a particular sense amplifier 206-2 and compute component 231-2 to another memory array (and isolate the particular sense amplifier 206-2 and compute component 231-2 from a first memory array). According to various embodiments, the shift circuitry 223 can be arranged as a portion of (e.g., within) a corresponding sense amplifier 206, for instance.

Although the shift circuitry 223-2 shown in FIG. 2A includes isolation transistors 221-1 and 221-2 used to couple a particular sensing component 250-2 (e.g., a particular sense amplifier 206-2 and corresponding compute component 231-2) to a particular pair of complementary data lines 205-1 (D) and 205-2 (D_) (e.g., DIGIT(n) and DIGIT(n)_) and isolation transistors 221-3 and 221-4 are arranged to couple the particular sensing component 250-2 to an adjacent pair of complementary data lines in one particular direction (e.g., adjacent data lines DIGIT(n+1) and DIGIT (n+1)_ shown to the right in FIG. 2A), embodiments of the present disclosure are not so limited. For instance, shift circuitry 223 can include isolation transistors (e.g., 221-1 and 221-2) used to couple particular sensing circuitry to a particular pair of complementary data lines (e.g., DIGIT(n) and DIGIT(n)) and isolation transistors (e.g., 221-3 and 221-4) arranged so as to be used to couple a particular sensing component (e.g., 250-2) to an adjacent pair of complementary data lines in another particular direction (e.g., adjacent data lines DIGIT(n−1) and DIGIT(n−1)_).

Embodiments of the present disclosure are not limited to the configuration of shift circuitry shown in FIG. 2A. For instance, determining whether to shift in a particular direction to perform a shift operation is independent of the circuitry implementation. In a number of embodiments, shift circuitry such as that shown in FIG. 2A (e.g., shift circuitry 223) can be operated (e.g., in conjunction with corresponding sensing components 250) in association with performing mathematical operations such as adding and subtracting operations without transferring data out of the sensing circuitry via an I/O line (e.g., local I/O line (IO/IO_)), for instance.

Although not shown in FIG. 2A, each column of memory cells can be coupled to a column decode line that can be activated to transfer, via a local I/O line (e.g., I/O line 334 in FIG. 3), a data value from a corresponding sense amplifier 206 and/or compute component 231 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry 223 can be operated in conjunction with sense amplifiers 206 and compute components 231 to perform logical operations without transferring data to a control component external to the array, for instance.

FIG. 2B is a schematic diagram illustrating a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206-2 shown in FIG. 2A) can comprise a number of transistors formed on pitch with the transistors of a corresponding compute component (e.g., 231-2 shown in FIG. 2A) and/or the memory cells of an array (e.g., 230 shown in FIG. 2A) to which they are coupled, which may conform to a particular feature size (e.g., $4F^2$, $6F^2$, etc.). Sense amplifier 206 shown in FIG. 2B comprises a latch 215 including four transistors coupled to a pair of complementary data lines D 205-1 and D_ 205-2. The latch 215 can be a cross coupled latch. For instance, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231 shown in FIG. 2AB can be a compute component such as compute component 231-2 shown in FIG. 2A.

In this example, a second source/drain region of transistor 227-1 and 227-2 is commonly coupled to an active negative control signal 228 (RnIF). A second source/drain region of transistors 229-1 and 229-2 is commonly coupled to an active positive control signal 265 (ACT). The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and corresponding compute component 231, and the result can be stored in the sense amplifier and/or compute component.

In a number of embodiments, sensing circuitry, such as a sensing component comprising sense amplifier 206 and compute component 231, can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry can be operated in both pre-sensing (e.g., sense amps fired before logical operation control signal active) and post-sensing (e.g., sense amps fired after logical operation control signal active) modes with a result of a logical operation being initially stored in the sense amplifier 206.

FIG. 3 illustrates a schematic diagram of a portion of a memory array 330 in accordance with a number of embodiments of the present disclosure. The array 330 includes memory cells (referred to generally as memory cells 303, and more specifically as 303-0 to 303-J) coupled to rows of access lines 304-0, 304-1, 304-2, 304-3, 304-4, 304-5, 304-6, . . . , 304-R (referred to generally as access lines 304) and columns of sense lines 305-0, 305-1, 305-2, 305-3, 305-4, 305-5, 305-6, 305-7, . . . , 305-S (referred to generally as sense lines 305). Memory array 330 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sense amplifiers 306-0, 306-1, 306-2, 306-3, 306-4, 306-5, 306-6, 306-7, . . . , 306-U (referred to generally as sense amplifiers 306) coupled to the respective sense lines 305-0, 305-1, 305-2, 305-3, 305-4, 305-5, 305-6, 305-7, . . . , 305-S. The sense amplifiers 306 are coupled to input/output (I/O) line 334 (e.g., a local I/O line) via access devices (e.g., transistors) 308-0, 308-1, 308-2, 308-3, 308-4, 308-5, 308-6, 308-7, . . . , 308-V. In this example, the sensing circuitry also comprises a number of compute components 331-0, 331-1, 331-2, 331-3, 331-4, 331-5, 331-6, 331-7, . . . , 331-X corresponding to respective sense amplifiers 306 and coupled to the respective sense lines 305. Column decode lines 310-1 to 310-W are coupled to the gates of transistors 308-1 to 308-V, respectively, and can be selectively activated to transfer data sensed by respective sense amplifiers 306-0 to 306-U and/or stored in respective compute components 331-0 to 331-X to a secondary sense amplifier 312. In a number of embodiments, the compute components 331 can be formed on pitch with the memory cells of their corresponding columns and/or with the corresponding sense amplifiers 306.

In a number of embodiments, the sensing circuitry (e.g., compute components 331 and sense amplifiers 306) is configured to perform a signed division operation on elements stored in array 330. As an example, a plurality of elements each comprising four data units (e.g., 4-bit elements) can be stored in a plurality of memory cells. A first 4-bit element of the plurality of elements can be stored in a first group of memory cells coupled to a first sense line (e.g., 305-0) and to a number of access lines (e.g., 304-0, 304-1, 304-2, 304-3), and a second element can be stored in a second group of memory cells coupled to a second sense line (e.g., 305-1) and to the number of access lines (e.g., sense lines 304-0, 304-1, 304-2, 304-3). As such, the first element and the second element are stored in a first column and a second column, respectively, of memory cells.

An example of a bitwise signed division operation is described below in association with FIG. 4A to 4E. FIGS. 4A to 4E each illustrate a table showing the states of memory cells of an array (e.g., 330) at a number of particular phases associated with performing a signed division operation in accordance with a number of embodiments described herein. In a number of examples, a signed division operation includes performing a number of AND operations, OR operations, SHIFT operations, INVERT operations, and/or BlockOR operations. The signed division operation can include performing the AND operations, OR operations, SHIFT operations, and/or INVERT operations without transferring data via an input/output (I/O) line to divide a first signed element by a second signed element. The number of AND operations, OR operations, INVERT operations, and SHIFT operations can be performed using sensing circuitry on pitch with the memory array and with each of a number of columns of complementary sense lines.

The reference numbers of the rows of the tables shown in FIG. 4A correspond to respective reference numbers of the pseudo code described below (e.g., row 451-1 corresponds to reference number 1 of the pseudo code, rows 451-2 to 451-13 correspond to reference number 2 to 13, respectively, of the pseudocode. Each row of the tables indicates the values of a number of bit vectors 431 (COMP_COMP), 433 (SIGNED_BIT), 435 (SIGNED_MASK_A), 437 (SIGNED_MASK_B), 443 (DIVIDEND), 445 (DIVISOR), 447 (QUOTIENT), and 449 (REMAINDER) at a particular phase of the SIGNED division operation as can be stored in rows and/or columns of memory cells in the array (e.g., 330 in FIG. 3).

The example shown in FIG. 4A is associated with dividing a first thirty-two (32) elements (e.g., dividends) stored in memory cells coupled to access lines (e.g., access lines 304-0, 304-1, 304-2, 304-3 in FIG. 3) and to sense lines (e.g., sense lines 305-0 to 305-31 in FIG. 3) by a respective second thirty-two (32) elements (e.g., divisors) stored in memory cells coupled to access lines (e.g., 304-4, 304-5, 304-6, 304-7 in FIG. 3) and to sense lines (e.g., 305-0 to 305-31 in FIG. 3). The elements illustrated in this example are in two's (2's) complement signed format. For instance, in order to indicate a sign of the element (e.g., positive or negative) a two's complement format is used. In a two's complement format, negative numbers are represented by a bit pattern which is one greater (in relation to the unsigned format) than the one's complement of the positive value. A one's complement format uses a bitwise NOT applied to a vector to indicate a negative binary number. In both a one's complement and two's complement format, a "1" bit value in the most significant bit position indicates a negative value (e.g., the "1" in "1000 0000"). For example, in a one's complement format, a binary number indicating –2 (e.g., "0010" in the non-negative, unsigned format) is indicated by "1101" (the NOT of "0010"). In a two's complement format, that same negative binary number of 2 is indicated by "1110." For instance, by adding a value of one to the one's complement value (e.g., 1101) to get "1110," a value of –2 in a two's complement format results. An example method to determine a base ten (10) numerical value of a two's complement value includes inverting the original bit value (e.g., "1110" for –2 in two's complement, resulting in "0001" when inverted), adding one bit value to the result (resulting in "0010"), and taking the negative of that value ("0010" represents 2 so resulting in –2).

In the example below, each of the first thirty-two (32) elements are represented by bit-vector [1001] ([0X9]), which is equal to a signed numerical base ten (10) value of –7. For instance, by inverting the original vector (e.g., [1001] inverted to [0110]), adding a bit value of one ("1") (e.g., [0110]+"1"=[0111]), and taking the negative (e.g., [0111] is 7, so negative of result is –7), you get the numerical value of a two's complement bit-vector. As illustrated in FIG. 4A, each of the elements is stored vertically in the example (e.g., each element being [1001]). For instance, a first of the 32 elements is [1001] where a most significant bit (e.g., bolded bit of [1001], which indicates a negative element under the two's complement format described previously) is stored in a memory cell coupled to access line 304-3 and sense line 305-0, a second most significant bit (e.g., bolded bit of [1001]) is stored in a memory cell coupled to access line 304-2 and sense line 305-0, a third most significant bit (e.g., bolded bit [1001]) is stored in a memory cell coupled to access line 304-1 and sense line 305-0, and a least significant bit (e.g., bolded bit of [1001]) is stored in a memory cell coupled to access line 304-0 and sense line 305-0. Each of the 32 elements of DIVIDEND 443 can be similarly stored in memory cells coupled to access lines 304-3, 304-2, 304-1, and 304-0 (corresponding to a most significant, second most significant, third most significant, and least significant bits). Further, a first element (e.g., [1001]) can be stored in memory cells coupled to sense line 305-0, a second element (e.g., [1001]) can be stored in memory cells coupled to sense line 305-1, a third element (e.g., [1001]) can be stored in memory cells coupled to sense line 305-2, and so forth where a thirty-second element (e.g., [1001]) can be stored in memory cells coupled to sense line 305-31.

As illustrated in FIG. 4A, the vertical elements can be demonstrated by a first row of DIVIDEND 443 being [0XFFFFFFFF] (binary [1111 1111 1111 1111 1111 1111 1111 1111] which represents a least significant bit of each of the dividend elements), a second row of DIVIDEND 443 being [0X00000000] (binary [0000 0000 0000 0000 0000 0000 0000 0000], which represents a third most significant bit of each of the dividend elements), a third row of DIVIDEND 443 being [0X00000000] (binary [0000 0000 0000 0000 0000 0000 0000 0000], which represents a second most significant bit of each of the dividend elements), and a fourth row of DIVIDEND 443 being [0XFFFFFFFF] (binary [1111 1111 1111 1111 1111 1111 1111 1111], which represents a most significant bit of each of the dividend elements).

In the example below, each of a second thirty-two (32) elements are represented by bit-vector [0011] ([0X3]), which is equal to a signed numerical base ten (10) value of 3. In this example, the second thirty-two elements of DIVISOR 445 include a "0" in the MSB position (e.g., fourth row of each of the elements illustrated in FIG. 4A) and are therefore positive elements. The second thirty-two (32) elements can be represented by bit-vector DIVISOR 445 (e.g., [0011] for each of the vertically stored elements). For instance, a first of the 32 elements is [0011] where a most significant bit (e.g., bolded bit of [0011]) is stored in a memory cell coupled to access line 304-7 and sense line 305-0 (which indicates a positive element under the two's complement format described previously), a second most significant bit (e.g., bolded bit of [0011]) is stored in a memory cell coupled to access line 304-6 and sense line 305-0, a third most significant bit (e.g., bolded bit [0011]) is stored in a memory cell coupled to access line 304-5 and sense line 305-0, and a least significant bit (e.g., bolded bit of [0011]) is stored in a memory cell coupled to access line 304-4 and sense line 305-0. Each of the 32 elements of DIVISOR 445 can be similarly stored in memory cells coupled to access lines 304-7, 304-6, 304-5, and 304-4 (corresponding to a most significant, second most significant, third most significant, and least significant bits). Further, a first element of DIVISOR 445 (e.g., first element [0011]) can be stored in memory cells coupled to sense line 305-0, a second element (e.g., [0011]) can be stored in memory cells coupled to sense line 305-1, a third element (e.g., [0011]) can be stored in memory cells coupled to sense line 305-2, and so forth where a thirty-second element (e.g., [0011]) can be stored in memory cells coupled to sense line 305-31.

As illustrated in FIG. 4A, the vertical elements can be demonstrated by a first row of DIVISOR 445 being [0XFFFFFFFF] (binary [1111 1111 1111 1111 1111 1111 1111 1111] which represents a least significant bit of each of the divisor elements), a second row of DIVISOR 445 being [0XFFFFFFFF] (binary [1111 1111 1111 1111 1111 1111 1111 1111], which represents a third most significant bit of each of the divisor elements), a third row of DIVISOR 445 being [0X00000000] (binary [0000 0000 0000 0000 0000 0000 0000 0000], which represents a second most significant bit of each of the divisor elements), and a fourth row of DIVISOR 445 being [0X00000000] (binary [0000 0000 0000 0000 0000 0000 0000 0000], which represents a most significant bit of each of the divisor elements).

The expected result of dividing DIVIDEND bit-vectors 443 by DIVISOR bit-vectors 445 is QUOTIENT bit-vectors 447 with a remainder indicated by REMAINDER bit-vectors 449, which is shown in row 451-13 of the table shown in FIG. 4A (e.g., at bit-vector columns 447 and 449). For instance, each of the QUOTIENT 447 elements is [1110], which indicates that dividing a first element of DIVIDEND 443 (e.g., [1001] representing numerical base ten value of −7) by a first element of DIVISOR 445 (e.g., [0011] representing numerical base ten value of 3) results in a first element of QUOTIENT 447 (e.g., [1110] representing numerical base ten value of −2) with a first element of REMAINDER 449 (e.g., [1111] representing numerical base ten value of −1).

In this example, the bit-vectors DIVIDEND 443 and DIVISOR 445 have a row-wise length of 32 bits and column-wise length of 4 bits and the "$i^{th}$" element of DIVIDEND 443 is divided by the "$i^{th}$" element of DIVISOR 445 (e.g., the first element of DIVIDEND 443 is divided by the first element of DIVISOR 445, the second element of DIVIDEND 443 is divided by the second element of DIVISOR 445, etc.), such that thirty-two element pairs are divided. In this example, the thirty-two elements represented by each of DIVIDEND 443 and DIVISOR 445 have a fixed length. For instance, the first through thirty-second elements of DIVIDEND 443 and DIVISOR 445 are represented by respective 4-bit vectors (e.g., each of the thirty-two elements comprise 4 bits). It is noted that although hexadecimal notation is used in FIG. 4A, the bit-vectors are stored as binary data patterns in the array during the signed division operation. Embodiments are not limited to a particular element size (e.g., to a particular number of elements and/or bits per element). The result of the signed division operation can be stored in array (e.g., 330) in which the vectors comprising the elements being divided are stored, and/or can be transferred external to the array (e.g., to functional unit circuitry of a host).

As described further below, the result of a signed division operation can be stored as a bit-vector in a particular group of memory cells. For instance, in the example of FIG. 4A, the memory cells corresponding to QUOTIENT 447 and REMAINDER 449 are used to store the result of the signed division operation. As such, at the conclusion of the example described in FIG. 4A, the value of QUOTIENT 447 [first row [0X00000000], second row [0XFFFFFFFF], third row [0XFFFFFFFF], and fourth row [0XFFFFFFFF]), which represents the thirty-two resultant quotient values corresponding to the thirty-two element pairs (e.g., each of quotients resulting from numerical values of −7/3=2), and binary [1001]/[0011]=[1110]) and the thirty-two resultant remainder values corresponding to the thirty-two element pairs (e.g., remainders of numerical values including −1, binary [1111]).

As described further below, the bit vectors 433 (SIGNED_BIT), 435 (SIGNED_MASK_A), 437 (SIGNED_MASK_B), 443 (DIVIDEND), 445 (DIVISOR), 447 (QUOTIENT), AND 449 (REMAINDER) can be used in association with dividing respective element pairs of the bit-vectors 443 and 445 (e.g., the elements of the signed Dividend bit-vectors by the respective elements of the signed Divisor bit-vectors). The bit-vectors 433, 435, 437, 447, and 449 can be stored in respective groups of memory cells coupled to particular access lines, which may be referred to as temporary storage rows. As used herein, temporary storage rows of memory cells are storing data that may be updated during various phases of a signed division operation. As an example, the bit-vectors 433, 435, 437, 447, and 449 can have a same length as the DIVIDEND and DIVISOR bit-vectors 443 and 445, respectively, and can be stored in cells coupled to the same sense lines as the DIVIDEND and DIVISOR bit-vectors (e.g., sense lines 305-0 to 305-31). For instance, the bit-vector 433 (SIGNED_BIT) can have a length of 32 bits and can be stored in a group of cells coupled to access line 304-8 (not shown) and to sense lines 305-0 to 305-31, the bit-vector 435 (SIGNED_MASK_A) can have a length of 32 bits and can be stored in a group of cells coupled to access line 304-9 (not shown) and to sense lines 305-0 to 305-31, the bit-vector 437 (SIGNED_MASK_B) can have a length of 32 bits and can be stored in a group of cells coupled to access line 304-10 (not shown) and to sense lines 305-0 to 305-31, the bit-vector 447 (QUOTIENT) can have a length of 32 bits and can be stored in a group of cells coupled to access lines 304-11 to 304-14 and to sense lines 305-0 to 305-31, and the bit-vector 449 (REMAINDER) can have a length of 32 bits and can be stored in a group of cells coupled to access lines 304-15 to 304-18 and to sense lines 305-0 to 305-31. The bit-vector 431 (COMP_COMP) represents the data stored in the sensing circuitry (e.g., compute components 331 and/or sense amplifiers 306) corresponding to the sense lines having cells coupled thereto which store elements being divided (e.g., sense lines 305-0 to 305-31 in this example).

In the example described in association with FIG. 4A, the first element of the DIVIDEND bit-vector 443 (e.g., binary value "1001" in the most significant element position, illustrated as the first vertically stored element to the far left) can be stored (e.g., as a four bit bit-vector [1001]) in memory cells coupled to access lines (e.g., 304-0 to 3-403) and a sense line (e.g., 305-0), and the first element of the DIVISOR bit-vector 445 (e.g., binary value "0011" in the most significant element position) can be stored (e.g., as a four bit bit-vector [0011]) in memory cells coupled to access lines (e.g., 304-4 to 304-7) and a sense line (e.g., 305-0). As an example, the most significant bits (MSBs) of the respective bit-vectors (e.g., [1001] of DIVIDEND 445 and [0011] of DIVISOR 445) can be stored in cells coupled to sense line 305-0 and access lines 304-3 and 304-7, respectively; the next MSBs of the respective bit-vectors can be stored in cells coupled to sense line 305-0 and access lines 304-2 and 304-6, respectively; the third MSBs of the respective bit-vectors can be stored in cells coupled to sense line 305-0 and access lines 304-1 and 304-5, respectively; and the least significant bits (LSBs) of the respective bit-vectors can be stored in cells coupled to sense line 305-0 and access lines 304-0 and 304-4, respectively. As used herein, the bottom-most bit of a bit-vector is considered the MSB; however, embodiments are not so limited. For example, in some examples, a top-most bit of a bit-vector can be considered the MSB.

The below pseudocode represents instructions executable to perform a number of signed division operations in a memory in accordance with a number of embodiments of the present disclosure. The example pseudocode is referenced using reference numbers 1-13, which correspond to the reference numbers of the rows shown in the tables of FIG. 4A and in reference to the column numbers of FIG. 4A. For instance, reference number 1 (e.g., "Load DIVIDEND, DIVISOR") corresponds to row 451-1, columns 443 and 445, reference number 2 (e.g., "Obtain All Temp Rows SIGNED_BIT, SIGNED_MASK_A, SIGNED_MASK_B") corresponds to row 451-2, columns 433, 435, and 437, and so forth.

1. Load DIVIDEND, DIVISOR;
2. Obtain All Temp Rows SIGNED_BIT, SIGNED_MASK_A, SIGNED_MASK_B;
3. Get MSB of DIVIDEND and Store as SIGNED_MASK_A;
4. Get MSB of DIVISOR and Store as SIGNED_MASK_B;
5. XOR SIGNED_MASK_A and SIGNED_MASK_B and Store as SIGNED_BIT;
6. Using SIGNED_MASK_A as mask, Negate DIVIDEND, Store as DIVIDEND;
7. Using SIGNED_MASK_B as mask, Negate DIVISOR, Store as DIVISOR;
8. Using Unsigned Dividend and Unsigned Divisor Perform Unsigned Division;
9. Negate QUOTIENT using SIGNED_BIT as mask;
10. Using SIGNED_MASK_A as mask, Negate DIVIDEND, Store as DIVIDEND;
11. Using SIGNED_MASK_B as mask, Negate DIVISOR, Store as DIVISOR;
12. Multiply Signed QUOTIENT and Signed DIVISOR, Store as REMAINDER;
13. Subtract REMAINDER from Signed DIVIDEND, resulting in Signed REMAINDER;

For purposes of discussion, the above pseudo code will be divided into a setup phase and a signed division phase associated with performing a signed division operation (e.g., dividing the thirty-two elements of the DIVIDEND bit-vector 443 by the corresponding thirty-two elements of the DIVISOR bit-vector 445). The pseudo code referenced by reference numbers 1-2 can correspond to the setup phase. The setup phase can be performed simultaneously for a number of the signed division operations. In the example illustrated in FIG. 4A, a bit-vector value illustrated in bold indicates a change in the value of the bit-vector (e.g., the value of the bit-vector stored in the memory cells corresponding to SIGNED_MASK_A 435 is shown in bold in FIG. 4A to indicate a change from [0X00000000] (as shown in row 451-2) to [0XFFFFFFFF] (as shown in row 451-3). FIG. 4A illustrates the values of a number of bit-vectors associated with performing the setup phase of a signed division operation at rows 451-1 to 451-2. The pseudo code referenced by reference numbers 3 to 13 can correspond to the signed division phase.

In a number of embodiments, the setup phase can be performed simultaneously for all of the elements that will be divided. The results (e.g., the resulting stored bit-vectors) corresponding to a number of operations performed in the setup phase are shown in FIG. 4A. Rows 451-1 to 451-2 of the table in FIG. 4A corresponds to the above pseudocode instructions referenced by reference numbers 1 to 2, respectively. As such, rows 451-1 to 451-2 indicate values of the bit vectors 433, 435, 437, 443, and 449 during execution of the setup phase as described by the above pseudocode. Reference number 1 (e.g., "Load DIVIDEND, DIVISOR") of the above pseudocode is associated with loading bit-vectors associated with a dividend (e.g., bit-vector [0XFFFFFFFF, 0X00000000, 0X00000000, 0XFFFFFFFF] stored as DIVIDEND 443) to be divided by a divisor (e.g., bit-vector [0XFFFFFFFF, 0XFFFFFFFF, 0X00000000, 0X00000000] stored as DIVISOR 445) and initializing temporary storage rows associated with a quotient (e.g., QUOTIENT 447) and a remainder (e.g., REMAINDER 449). Notation for illustrating DIVIDEND 443, DIVISOR 445, QUOTIENT 447, and REMAINDER 449 includes separating each corresponding row by a comma. For example, DIVIDEND 443 is described as [0XFFFFFFFF, 0X00000000, 0X00000000, 0XFFFFFFFF], where [0XFFFFFFFF] is a first row illustrated and a least significant bit of each of the elements of DIVIDEND 443, [0X00000000] is a second row illustrated and a third most significant bit of each of the elements of DIVIDEND 443, [0X00000000 is a third row illustrated and a second most significant bit of each of the elements of DIVIDEND 443, and [0XFFFFFFFF] is a fourth row illustrated and a most significant bit of each of the elements of DIVIDEND 443. Likewise, DIVISOR is described as [0XFFFFFFFF, 0XFFFFFFFF, 0X00000000, 0X00000000], where [0XFFFFFFFF] is a first row illustrated and a least significant bit of each of the elements of DIVISOR 445, [0XFFFFFFFF] is a second row illustrated and a third most significant bit of each of the elements of DIVISOR 445, [0X00000000] is a third row illustrated and a second most significant bit of each of the elements of DIVISOR 445, and [0X00000000] is a fourth row illustrated and a most significant bit of each of the elements of DIVISOR 445.

Reference number 2 (e.g., "Obtain All Temp Rows SIGNED_BIT, SIGNED_MASK_A, SIGNED_MASK_B") of the above pseudocode is associated with initializing a number of groups of memory cells for use as temporary storage rows to be used to store bit-vectors (e.g., 433, 435, and 437). Initializing refers to designating and/or assigning particular access lines used to store particular bit-vectors for performing the signed division operation. For instance, the number of groups of memory cells can be initialized and/or designated groups of cells that can be coupled to respective access lines (e.g., rows) that store data (e.g., on a temporary basis) in association with performing the division operation. For example, a first group of memory cells can be coupled to a particular access line (e.g., 304-8, ROW 8, not shown) and can store a bit-vector referred to as a "SIGNED_BIT" bit-vector 433. A second group of memory cells can be coupled to another access line (e.g., 304-9, ROW 9 not shown) and can store a bit-vector referred to as a "SIGNED_MASK_A" bit-vector 435. A third group of memory cells can be coupled to another access line (e.g., 304-10, ROW 10, not shown) and can store a bit-vector referred to as a "SIGNED_MASK_B" bit-vector 437. Embodiments are not limited to a particular number of temporary storage rows and/or to storage of the corresponding bit-vectors on particular access lines. Also, although the groups of memory cells used to store bit-vectors 433, 435, and 437 may be referred to as "rows," the respective groups of memory cells may comprise fewer than all of the cells coupled to a particular access line (e.g. ROW). Furthermore, in a number of embodiments, temporary storage rows can refer to access lines which may not be addressable by a user (e.g., access lines that are outside of a user-addressable address space).

In a number of examples, the elements stored in memory cells corresponding to access lines are stored in memory cells coupled to the access lines as the element pairs that are being divided. For instance, a first element of DIVIDEND 443 (e.g., a most significant element) and a first element of DIVISOR 445 (e.g., a most significant element) can be stored in memory cells coupled to same access lines and different sense lines. Likewise and similarly, the MSBs of DIVIDEND 443 and DIVISOR 445 (e.g., fixed length element dividends and fixed length element divisors, respectively) can be stored in memory cells coupled to a same access line as the access line to which the memory cells storing the MSBs of QUOTIENT 447 and REMAINDER 449.

At the conclusion of the setup phase corresponding to reference numbers 1-2 of the above pseudocode, and as shown in row 451-2 of FIG. 4A, SIGNED_BIT 433 stores [0X00000000] (e.g., binary [0000 0000 0000 0000 0000 0000 0000 0000]), SIGNED_MASK_A 435 stores [0X00000000] (e.g., binary [0000 0000 0000 0000 0000 0000 0000 0000]), SIGNED_MASK_B 437 stores [0X00000000] (e.g., binary [0000 0000 0000 0000 0000 0000 0000 0000]), QUOTIENT 447 stores [0X00000000], and REMAINDER 449 stores [0X00000000]. DIVIDEND 443 stores [0XFFFFFFFF, 0X00000000, 0X00000000, 0XFFFFFFFF], where each of the thirty-two (32) elements (e.g., each of [1001]) of DIVIDEND 443 represents a decimal value of "–7." DIVISOR 445 stores [0XFFFFFFFF, 0XFFFFFFFF, 0X00000000, 0X00000000], where each of the thirty-two (32) elements (e.g., each of [0011], since the first row represents a least significant bit (e.g., "1" in this example), the second row represents a third most significant bit (e.g., "1" in this example), the third row represents a second most significant bit (e.g., "0" in this example), and the fourth row represents a most significant bit (e.g., "0" in this example)) of DIVISOR 445 represents a decimal value of "3."

Reference numbers 3-18 of the above pseudocode corresponds to the division phase of a signed division operation in accordance with a number of embodiments of the present disclosure. Reference number 3 (e.g., "Find MSB For DIVIDEND, Store as SIGNED_MASK_A") of the above pseudocode is associated with finding a most significant bit for each element of DIVIDEND 443 and storing the result as SIGNED_MASK_A 435. The most significant bit (MSB) for each of the elements in DIVIDEND 443 is represented by the fourth row of element bits (e.g., fourth row [0XFFFFFFFF]). The most significant bit for each of the elements in DIVIDEND 443 (e.g., [0XFFFFFFFF]) is stored as SIGNED_MASK_A 435, as illustrated at 451-3 corresponding to reference number 3. Reference number 4 (e.g., "Find MSB For DIVISOR<Store as SIGNED_MASK_B") of the above pseudocode is associated with finding a most significant bit for each element of DIVISOR 445 and storing the result as SIGNED_MASK_B 437. The most significant bit (MSB) for each of the elements in DIVISOR 445 is represented by the fourth row of element bits (e.g., fourth row [0X00000000]). The most significant bit for each of the elements in DIVISOR 445 (e.g., [0X00000000]) is stored as SIGNED_MASK_B 437, as illustrated at 451-4 corresponding to reference number 4.

Reference number 5 (e.g., "XOR SIGNED_MASK_A and SIGNED_MASK_B and Store as SIGNED_BIT") of the above pseudocode is associated with performing an XOR operation on SIGNED_MASK_A 435 and SIGNED_MASK_B 437 and storing as SIGNED_BIT 433. An XOR operation on two bit-vectors can include performing a number of NAND, OR, and AND operations. The XOR operation on the two bit-vectors can include performing an AND operation on a result of a NAND operation and a result of an OR operation (e.g., A XOR B=(A OR B) AND (A NAND B)). For example, an XOR operation can be performed on a first bit-vector (e.g., [0011]) and a second bit-vector (e.g., [0110]). The XOR operation includes a NAND operation that can be performed on the first and second bit-vector, resulting in a bit-vector [1101] (e.g., ANDing [0011] and [0110] to result in [0010], and inverting the [0010] bit-vector to result in an XOR result of [1101]). The XOR operation includes an OR operation that can be performed on the first and second bit-vector, resulting in bit-vector [0111] (e.g., ORing [0011] and [0110]). The XOR operation includes an AND operation that can be performed on the result of the NAND operation (e.g., NAND operation result [1101]) and the result of the OR operation (e.g., OR operation result [0111]). The result of the AND operation (e.g., ANDing [1101] and [0111]) is bit-vector [0101], which is the result of an XOR operation performed on the first bit-vector (e.g., [0011]) and the second bit-vector (e.g., [0110]). Performing an XOR on SIGNED_MASK_A 435 (e.g., [0XFFFFFFFF]) and SIGNED_MASK_B 437 (e.g., [0X00000000]) results in bit-vector [0XFFFFFFFF]. The resulting bit-vector [0XFFFFFFFF] is stored as SIGNED_BIT 433, as illustrated at 451-5.

Reference number 6 (e.g., "Using SIGNED_MASK_A as mask, Negate DIVIDEND, Store as DIVIDEND") of the above pseudocode is associated with performing a negation operation using a mask (e.g., SIGNED_MASK_A [0XFFFFFFFF]) that indicates which elements are signed (e.g., which elements are negative if there is a "1" bit value in the MSB position). The negation operation converts a two's complement signed value into an unsigned value (e.g., a value of –7 represented by [1001] to a value of 7 represented by [0111]). SIGNED_MASK_A 435 (e.g., [0XFFFFFFFF]) indicates that each element is signed and therefore each element has a negation performed. For example, DIVIDEND 443 (e.g., [0XFFFFFFFF, 0X00000000, 0X00000000, 0XFFFFFFFF) is negated to determine an unsigned bit-vector for DIVIDEND 443. Negation can include performing an INVERT operation on DIVIDEND 443 (resulting in each element being [0110], where DIVIDEND 443 is [0X00000000, 0XFFFFFFFF, 0XFFFFFFFF, 0X00000000) and adding a value of "1" (e.g., adding [0XFFFFFFF] to the first row (e.g., least significant bit) of each element) to DIVIDEND 443, resulting in [0XFFFFFFFF, 0XFFFFFFFF, 0XFFFFFFFF, 0X00000000], as illustrated at row 451-6 and column 443 of DIVIDEND. The result of performing the negation operation using the mask (e.g., SIGNED_MASK_A) is an unsigned DIVIDEND 443

Reference number 7 (e.g., "Using SIGNED_MASK_A as mask, Negate DIVIDEND, Store as DIVIDEND") of the above pseudocode is associated with performing a negation operation using a mask (e.g., SIGNED_MASK_B [0X00000000]) that indicates which elements are signed (e.g., which elements are negative if there is a "1" bit value in the MSB position). Since SIGNED_MASK_B is [0X00000000], indicating that there are no negative elements to be negated, DIVISOR 445 (e.g., [0XFFFFFFFF, 0XFFFFFFFF, 0X00000000, 0X00000000]) remains the same, as illustrated at 451-7, column 445 of DIVISOR. The result of performing the negation operation using the mask (e.g., SIGNED_MASK_B) is an unsigned DIVISOR 445 (in this example the same as the Signed DIVISOR 445 since the MSB of each of the elements is "0").

Reference number 8 (e.g., "Using Unsigned Dividend and Unsigned Divisor Perform Unsigned Division") of the above pseudocode is associated with performing an unsigned division operation on the unsigned DIVIDEND 443 (resulting from reference number 6), and the unsigned DIVISOR 445 (resulting from reference number 7). An example of the unsigned division operation is described below in the description of FIG. 4B. Dividing the unsigned DIVIDEND 443 (e.g., [0XFFFFFFFF, 0XFFFFFFFF, 0XFFFFFFFF, 0X00000000]) by the unsigned DIVISOR 445 (e.g., 0XFFFFFFFF, 0XFFFFFFFF, 0X00000000, 0X00000000]) results in QUOTIENT 447 of [0X00000000, 0XFFFFFFFF, 0X00000000, 0X0000000] and REMAINDER 449 [0XFFFFFFFF, 0X00000000, 0X00000000, 0X00000000], as illustrated at 451-8 and columns 447 and 449 of QUOTIENT and REMAINDER, respectively.

Reference number 9 (e.g., "Negate QUOTIENT using SIGNED_BIT as mask") of the above pseudocode is associated with negating a QUOTIENT 447 (e.g., each element of [0010] indicated by bit-vectors [0X00000000, 0XFFFFFFFF, 0X00000000, 0X0000000]) using SIGNED_BIT 433 (e.g., [0XFFFFFFFF). Since SIGNED_BIT 433 is [0XFFFFFFFF], each of the elements are negated. QUOTIENT 447 is inverted, resulting in each element being [1101] and QUOTIENT 447 being [0XFFFFFFFF, 0X00000000, 0XFFFFFFFF, 0XFFFFFFFF]. The negation includes adding a "1" to each element, resulting in [1110] for each element, indicated by bit-vectors for QUOTIENT 449 being [0X00000000, 0XFFFFFFFF, 0XFFFFFFFF, 0XFFFFFFFF].

Reference number 10 (e.g., "Using SIGNED_MASK_A as mask, Negate DIVIDEND, Store as DIVIDEND") of the above pseudocode is associated with performing a negation operation on DIVIDEND 443 (e.g., each element being [0111] indicated by bit-vectors [0XFFFFFFFF, 0XFFFFFFFF, 0XFFFFFFFF, 0X00000000]) using SIGNED_MASK_A 435 (e.g., [0XFFFFFFFF]), resulting in each element being [1001] indicated by bit-vectors [0XFFFFFFFF, 0X00000000, 0X00000000, 0XFFFFFFFF], as illustrated at 451-10 in column 443 of DIVIDEND. Reference number 11 (e.g., Using SIGNED_MASK_B as mask, Negate DIVISOR, Store as DIVISOR) of the above pseudocode is associated with performing a negation operation on DIVISOR 445 (e.g., each element being [0011], indicated by bit-vectors [0XFFFFFFFF, 0XFFFFFFFF, 0X00000000, 0X00000000]) using SIGNED_MASK_B 437 (e.g., [0X00000000]), resulting in each element being [0011], indicated by bit-vectors [0XFFFFFFFF, 0XFFFFFFFF, 0X00000000, 0X00000000] since SIGNED_MASK_B 437 indicates that none of the elements of DIVISOR 445 will be negated.

Reference number 12 (e.g., "Multiply Signed QUOTIENT and Signed DIVISOR, Store as REMAINDER") of the above pseudocode is associated with performing a multiplication operation on Signed QUOTIENT 447 and Signed DIVISOR 445 and storing as REMAINDER 449. The multiplication operation is described further below in relation to FIG. 4C. Multiplying signed QUOTIENT 447 (e.g., [0X00000000, FFFFFFFF, 0XFFFFFFFF, 0XFFFFFFFF], where each element is [1110]) by signed DIVISOR 445 (e.g., [0XFFFFFFFF, 0XFFFFFFFF, 0X00000000, 0X00000000], where each element is [0011]) results in bit-vectors [0X00000000, 0XFFFFFFFF, 0X00000000, 0XFFFFFFFF, where each element is 1010] stored as REMAINDER 449.

Reference number 13 (e.g., "Subtract REMAINDER from Signed DIVIDEND, resulting in Signed REMAINDER") of the above pseudocode is associated with subtracting REMAINDER 449 (e.g., [0X00000000, 0XFFFFFFFF, 0X00000000, 0XFFFFFFFF]) from Signed DIVIDEND 443 (e.g., [0XFFFFFFFF, 0X00000000, 0X00000000, 0XFFFFFFFF]), resulting in bit-vectors [0XFFFFFFFF, 0XFFFFFFFF, 0XFFFFFFFF, 0XFFFFFFFF] as the signed REMAINDER 449. An example of subtracting a first bit-vector from a second bit-vector is described in further detail below in relation to FIG. 4E.

In this example, at the conclusion of a signed division operation of elements stored in memory cells coupled to a sense line and a number of access lines, a group of dividend elements (e.g., DIVIDEND 443 where each element is [1001], representing decimal value −7) is divided by a group of divisor elements (e.g., DIVISOR 445 where each element is [0011], representing decimal value 3), resulting in a group of quotient elements (e.g., QUOTIENT 447 where each element is [1110], representing decimal value −2) and a group of remainder elements (e.g., REMAINDER 449 where each element is [1111], representing decimal value −1).

FIGS. 4B-4E each illustrate tables showing the states of memory cells of an array at a particular phase associated with performing a signed division operation in accordance with a number of embodiments of the present disclosure. While the illustrated examples in FIGS. 4B-4E show 4 bits illustrated in a row for ease of explanation, the 4 bits are stored in a similar fashion to those in FIG. 4A. For example, a first bit "0" of [0100] can be stored in a memory cell coupled to access line 304-3 and sense line 305-0, a second bit "0" of [0100] can be stored in a memory cell coupled to access line 304-2 and sense line 305-0, a third bit "1" of [0100] can be stored in a memory cell coupled to access line 304-1 and sense line 305-0, and a fourth bit "0" of [0100] can be stored in a memory cell coupled to access line 304-0 and sense line 305-0. In this manner, element [0100] can be stored in cells coupled to a sense line and a number of access lines even though illustrated as in a row for ease of reference. For example, the first bit is stored in a bottom-most cell as illustrated, the second bit is stored in a second bottom-most cell, the third bit is stored in a third bottom-most cell, and the fourth bit is stored in a top cell, as illustrated.

FIG. 4B illustrates a table showing the states of memory cells of an array at a particular phase associated with performing an unsigned division portion of a signed division operation in accordance with a number of embodiments of the present disclosure. For example, FIG. 4B is associated with reference number 8 described above in association with FIG. 4A and performing an unsigned division operation. An example unsigned division operation described below is performed in association with dividing an example element A (e.g., [0100]) by an example element B (e.g., [0010]). FIG. 4B is associated with the following pseudocode below.

| | | |
|---|---|---|
| 8.0 | | Obtain Temp Rows A, B, Q, R |
| 8.1 | | For all elements Q = 0, R = A |
| 8.2 | | LOOP for all elements (R + INV(B)) >= 1111 |
| | 8.2a | R = SUB(R,B) |
| | 8.2b | Q = ADD(Q, "1") |

Reference number 8.0 (e.g., "Obtain Temp Rows, A, B, Q, R") of the above pseudocode is associated with initializing temporary storage rows "A", "B", "Q", and "R", in this example. Reference number 8.1 (e.g., "For all element Q=0, R=A") of the above pseudocode is associated with storing bit-vector [0000] as bit-vector Q (e.g., [0000]) and element A (e.g., [0100]) as bit-vector R 441, as illustrated at 451-8.1 in FIG. 4B. Reference number 8.2 (e.g., "LOOP for all elements (R+INV(B))>=1111 is associated with performing a For LOOP on the elements until bit-vector R 441+the invert of bit-vector B 439 is not equal to or greater than bit-vector [1111].

During a first iteration of the LOOP (associated with 451-8.2.1 to 451-8.2.1*b*), an operation is performed (e.g., "(R+INV(B))>=1111") including ADDing R 441 (e.g., [0100]) and the invert of B 439 (e.g., invert of [0010] results in [1101]) using compute components (e.g., 331 in FIG. 3), which equals [10001] and is determined at 451-8.2.1. Performing an ADD operation is described below in association with FIG. 4D. Bit-vector [10001] is greater than [1111], so the first iteration of the LOOP proceeds. Reference number 8.2*a* (e.g., "R=SUB R,B") of the above pseudocode is associated with R equal to R subtracting (e.g., minus) B. Subtraction of elements is described below in association with FIG. 4E. For example, B439 (e.g., [0010]) is subtracted from R 441 (e.g., [0100]), resulting in bit-vector [0010] stored as R 441 at 451-8.2.1*a*. Reference number 8.2*b* (e.g., "Q=ADD (Q, "1") of the above pseudocode is associated with adding a "1" value to bit-vector Q 440 (e.g., [0000]), resulting in bit-vector [0001] being stored as Q 440 at 451-8.2.1*b*.

During a second iteration of the LOOP (associated with 451-8.2.2 to 451-8.2.2*b*), an operation is performed (e.g., "(R+INV(B))>=1111") including ADDing R 441 (e.g., [0010]) with invert B (e.g., invert of [0010] results in [1101]) using compute components (e.g., 331 in FIG. 3), resulting in [1111]. Since [1111] is equal to [1111], the second iteration of the LOOP continues. Reference number 8.2*a* (e.g., "R=SUB R,B") of the above pseudocode is associated with R equal to R subtracting (e.g., minus) B. For example, B 439 (e.g., [0010]) is subtracted from R 441 (e.g., [0010]), resulting in bit-vector [0000] stored as R 441 at 451-8.2.2*a*. Reference number 8.2*b* (e.g., "Q=ADD (Q, "1") of the above pseudocode is associated with adding a "1" value to bit-vector Q 440 (e.g., [0001]), resulting in bit-vector [0010] being stored as Q 440 at 451-8.2.2*b*.

During a third iteration of the LOOP (associated with 451-8.3), an operation is performed (e.g., "(R+INV (B))>=1111") including ADDing R 441 (e.g., [0000]) with invert B (e.g., invert of [0010] results in [1101]) using compute components (e.g., 331 in FIG. 3), resulting in [1101]. Since [1101] is less than [1111], the third iteration is terminated. At 451-8.2.3, bit-vector Q 440 (e.g., [0010]) is the result of the unsigned division operation performed on bit-vectors A 438 (e.g., [0100]) and B 439 (e.g., [0010])

FIG. 4C illustrates a table showing the states of memory cells of an array at a particular phase associated with performing a multiplication operation phase of the signed division operation in accordance with a number of embodiments of the present disclosure. For example, FIG. 4C is associated with reference number 12 described above in association with FIG. 4A and performing a multiplication operation. An example multiplication operation described below is performed in association with dividing an example element A (e.g., [0010]) by an example element B (e.g., [0010]). FIG. 4C is associated with the following pseudocode below.

| | |
|---|---|
| 12.1 | For All Elements C = A |
| 12.2 | For All Elements Start Iteration from LSB |
| 12.2.a | Load Iteration from B in B' |
| 12.2.b | If Any Bits in B' True Then |
| 12.2.c | ADD (C, B') |
| 12.3 | Return C |

Reference number 12.1 (e.g., "For All Elements C=A") of the above pseudocode is associated with copying what is stored as element A (e.g., [0010]) as element C, as illustrated at 451-12.1. Reference number 12.2 (e.g., "For All Elements Start Iteration from LSB") is associated with performing a For LOOP on the elements (e.g., A, B, C, B') equal to a length of the elements (e.g., 4 bits in this example). During a first iteration of the For LOOP (associated with 451-12.2.1*a* to 451-12.2.1*b*), reference number 12.2*a* (e.g., "Load Iteration from B in B'") of the above pseudocode is associated with loading a least significant bit corresponding to a first iteration. For example, a first bit (e.g., least significant bit) can be loaded during a first iteration, a second bit (e.g., third most significant bit) can be loaded during a second iteration, a third bit (e.g., a second most significant bit) can be loaded during a third iteration, and a fourth bit (e.g., most significant bit) can be loaded during a fourth iteration. A least significant bit of B 456 (e.g., bolded bit in element B) can be loaded as B' 452 (e.g., [0000]), as illustrated at 451-12.2.1*a*.

Reference number 12.2.*b* (e.g., "If Any Bits in B' True Then") of the above pseudocode is associated with determining whether a data value (e.g., bit) of element B' 452 (e.g., [0000]) includes a particular data value (e.g., a "1" or "true" bit), as illustrated at 451-12.2.1*b*. Since B' 452 (e.g., [0000]) does not include a "1", the first iteration does not continue to reference number 12.2.*c* (e.g., "ADD (C, B')"). In order to determine this, a BlockOR can be performed. In a number of embodiments, a "BlockOR" operation can be performed in association with determining whether one or more (e.g., any) of the compute components (e.g., 331-0 to 331-X) and/or sense amplifiers (e.g., 306-0 to 306-U) coupled to a particular group of sense lines (e.g., 305-0 to 305-S) store a particular data value (e.g., a "1" or a "0"). For example, determining whether any of the compute components 331-0 to 331-31 coupled to sense lines 305-0 to 305-31 store a particular data value can include charging (e.g., precharging) a local I/O line such as local I/O line 334 shown in FIG. 3) to a particular voltage, and then sensing (e.g., via a secondary sense amplifier, such as SSA 312 shown in FIG. 3) whether the voltage on the local I/O line changes (e.g., by more than a threshold amount) responsive to transferring (e.g., in parallel) the voltages corresponding to the data latched in the selected compute components 331-0 to 331-31 to the local I/O line. The I/O line (e.g., I/O line 334) can be precharged via control circuitry such as control circuitry 140 shown in FIG. 1 and/or sensing circuitry such as circuitry 150 shown in FIG. 1, for instance, to a voltage such as a supply voltage (e.g., Vcc) or a ground voltage (e.g., 0V). In this example, a determination of whether a compute component coupled to the sense line that the memory cells storing B' are coupled to stores a "1" can be performed.

Transferring the voltages corresponding to the data latched in the selected compute components 331-0 to 331-31 (e.g., whichever compute component is coupled to a sense line coupled to the cells storing the particular element of interest) can include activating (e.g., in parallel) the column decode lines (e.g., column decode lines 310-0 to 310-W in FIG. 3) corresponding to the selected sensing circuitry (e.g., compute components 331-0 to 331-31 in this example) such that respective transistors 308-0 to 308-31 are enabled (e.g., turned on).

As an example, to determine whether one or more of the selected compute components 331-0 to 331-31 stores (e.g., latches) a data value of "1" (e.g., a logic 1 which can be represented by a supply voltage Vcc), the local I/O line (e.g., I/O line 334) can be precharged to a ground voltage (e.g., 0V, which can represent a latched data value of "0"). The corresponding column decode lines 310-0 to 310-31 (e.g., column decode line corresponding to the cells storing the particular element of interest) can be activated, and if one or more of the selected compute components 331-0 to 331-31 stores a logic 1 (e.g., Vcc), then the SSA (e.g., SSA 312) can sense a pull up (e.g., increase) of the voltage on the I/O line (e.g., I/O line 334) which indicates that at least one of the selected compute components 331-0 to 331-31 stores a "1," which can be indicated by the BlockOR operation returning a "true" bit (e.g., "1"). In this example, if none of the compute components 331-0 to 331-31 stored a "1," then the voltage on the I/O line would not be pulled up, which can be indicated by the BlockOR operation returning a false bit (e.g., "0").

Alternatively, to determine whether one or more of the selected compute components 331-0 to 331-31 stores (e.g., latches) a data value of "0," the I/O line (e.g., I/O line 334) can be pre-charged to a supply voltage (e.g., Vcc). The corresponding column decode lines 310-0 to 310-31 can be activated, and if one or more of the selected compute components 331-0 to 331-31 stores a logic 0 (e.g., 0V), then the SSA (e.g., SSA 312) can sense a pull down (e.g., decrease) of the voltage on the I/O line (e.g., I/O line 334) which indicates that at least one of the selected compute components 331-0 to 331-31 stores a "0."

The determination of whether one or more compute components (e.g., 331-0 to 331-X) and/or sense amplifiers (e.g., 306-0 to 306-U) coupled to selected column decode lines (e.g., column decode lines 310-0 to 310-W) stores a particular data value (e.g., a data value of "1") is effectively performing a logic "OR" operation (e.g., since the operation returns a "1" if any of the data values are "1" and the operation returns a "0" only if all of the data values are "0"), which is why the operation may be referred to as a "BlockOR" operation. Embodiments of the present disclosure are not limited to particular pre-charge voltages of the local I/O line and/or to particular voltage values corresponding to logic "1" and logic "0".

In this example, during a second iteration of the For LOOP (associated with 451-12.2.2a to 451-12.2.2c), reference number 12.2a (e.g., "Load Iteration from B in B'") of the above pseudocode is associated with loading a third most significant bit corresponding to a second iteration. For example, a second bit (e.g., third most significant bit) can be loaded as element B' (e.g., second bit bolded of [0010]) during the second iteration, as illustrated at 451-12.2.2a in column 452.

Reference number 12.2.b (e.g., "If Any Bits in B' True Then") of the above pseudocode is associated with determining whether a data value (e.g., bit) of element B' 452 (e.g., [0010]) includes a particular data value (e.g., a "1" or "true" bit), as illustrated at 451-12.2.2b. Performing a BlockOR determines that B' 452 (e.g., [0010]) does include a "1" (e.g., includes a "true" bit), the second iteration continues. At reference number 12.2.c (e.g., "ADD (C, B')"), An addition operation is performed on element C 458 (e.g., [0010]) and element B' 452 (e.g., [0010]), resulting in [0100] as stored as element C 458 at 451-12.2.2c. An addition operation is described below in FIG. 4D.

In this example, during a third iteration of the For LOOP (associated with 451-12.2.3a to 451-12.2.3b), reference number 12.2a (e.g., "Load Iteration from B in B'") of the above pseudocode is associated with loading a second most significant bit corresponding to a third iteration. For example, a third bit (e.g., second most significant bit) can be loaded as element B' (e.g., third bit bolded of [0000]) during the third iteration, as illustrated at 451-12.2.3a in column 452.

Reference number 12.2.b (e.g., "If Any Bits in B' True Then") of the above pseudocode is associated with determining whether a data value (e.g., bit) of element B' 452 (e.g., [0000]) includes a particular data value (e.g., a "1" or "true" bit), as illustrated at 451-12.2.3b. Performing a BlockOR determines that B' 452 (e.g., [0000]) does not include a "1" (e.g., does not include a "true" bit) and therefore the third iteration does not continue.

In this example, during a fourth iteration of the For LOOP (associated with 451-12.2.4a to 451-12.2.4b), reference number 12.2a (e.g., "Load Iteration from B in B'") of the above pseudocode is associated with loading a most significant bit corresponding to a fourth iteration. For example, a fourth bit (e.g., most significant bit) can be loaded as element B' (e.g., fourth bit, bolded in [0000]) during the fourth iteration, as illustrated at 451-12.2.4a in column 452.

Reference number 12.2.b (e.g., "If Any Bits in B' True Then") of the above pseudocode is associated with determining whether a data value (e.g., bit) of element B' 452 (e.g., [0000]) includes a particular data value (e.g., a "1" or "true" bit), as illustrated at 451-12.2.4b. Performing a BlockOR determines that B' 452 (e.g., [0000]) does not include a "1" (e.g., does not include a "true" bit) and therefore the fourth iteration does not continue.

Reference number 12.3 (e.g., "Return C") is associated with returning (e.g., loading, copying) an element stored as element C 458 (e.g., [0100]) as a result of the multiplication operation associated with FIG. 4C.

FIG. 4D illustrates a table showing the states of memory cells of an array at a particular phase associated with performing an addition operation phase of the signed division operation in accordance with a number of embodiments of the present disclosure. For example, FIG. 4D is associated with reference number 8.2.b of FIG. 4B and/or 12.2.c of FIG. 4C described above in association with performing an addition. An example addition operation described below is performed in association with adding an example element A (e.g., [0010]) with an example element B (e.g., [0001]). FIG. 4D is associated with the following pseudocode below.

```
0.      Load elements A, B, Get Temp C, CARRY
1.      For All Elements, Starting With LSB, C = A XOR B
  1.a   Starting with LSB, CARRY = A AND B
  1.b   If Any Bits in CARRY true, then
        1.b.i   CARRY = Down Shift Carry
        1.b.ii  C = C XOR CARRY
```

Reference number 0 (e.g., "Load elements A, B, Get Temp C, CARRY") of the above pseudocode is associated with loading element A (e.g., [0010]) and element B (e.g., [0001]) as elements A 464 and B 466. In addition, temporary storage rows C and CARRY are initialized.

Reference number 1 (e.g., "For All Elements, Starting with LSB, C=A XOR B") of the above pseudocode is associated with performing an XOR operation on bit position corresponding to a particular iteration (e.g., in a first iteration, a LSB, in a second iteration a second least significant bit, in a third iteration, a second most significant bit, and in a fourth iteration, a most significant bit position). For example, XORing LSBs of A and B (e.g., bolded bits of [0000] and [0001]) results in element [0001] being stored as C 468 as illustrated at 453-1.1.

Reference number 1.*a* (e.g., "Starting LSB, CARRY=A AND B") of the above pseudocode is associated with starting with a least significant bit (LSB) position corresponding to a particular iteration (e.g., in a first iteration, a LSB, in a second iteration a second least significant bit, in a third iteration, a second most significant bit, and in a fourth iteration, a most significant bit position). For example, in this first iteration, an LSB bit of A 464 (e.g., bolded bit [0010]) is ANDed with an LSB of B 466 (e.g., bolded bit [0001]), resulting in element [0000] stored as CARRY 462. A BlockOR (as described above) is performed to determine if any bits of CARRY 462 are "true" (e.g., include a "1"). Since no bits include a "true" bit during the first iteration, reference numbers 1.*b.i* and 1.*b.ii* are not performed. However, for example, had a CARRY element been [0001], the CARRY element [0001] would have been shifted to result in [0010] and XORed with C (e.g., [0001]), resulting in [0011].

During a second iteration, reference number 1 (e.g., "For All Elements, Starting with LSB, C=A XOR B") of the above pseudocode is associated with performing an XOR operation on bit position corresponding to a particular iteration (e.g., in a second iteration). For example, XORing a second least significant bit and LSBs of A and B (e.g., bolded bits of [0010] and [0001]) results in element [0011] being stored as C 468 as illustrated at 453-1.2.

Reference number 1.*a* (e.g., "Starting LSB, CARRY=A AND B" for a second iteration associated with 453-1.2*a*) of the above pseudocode is associated with starting with a second least significant bit (LSB) position corresponding to a particular iteration (e.g., in a second iteration). For example, in this second iteration, a second least significant bit of A 464 (e.g., bolded bit [0010]) is ANDed with a second LSB of B 466 (e.g., bolded bit [0001]), resulting in element [0000] stored as CARRY 462. A BlockOR (as described above) is performed to determine if any bits of CARRY 462 are "true" (e.g., include a "1"). Since no bits include a "true" bit during the second iteration, reference numbers 1.*b.i* and 1.*b.ii* are not performed.

During a third and fourth iteration, CARRY 462 remains [0000] and element C 468 remains [0011]. Since CARRY 462 remains [0000], there is no shifting associated with numbers 1.*bi* and 1.*bii*. The result of the addition operation on A 464 (e.g., [0010]) and B 466 (e.g., [0001]), results in element [0011].

FIG. 4E illustrates a table showing the states of memory cells of an array at a particular phase associated with performing a subtraction operation phase of the signed division operation in accordance with a number of embodiments of the present disclosure. For example, FIG. 4E is associated with reference number 13 of FIG. 4A described above in association with performing a subtraction operation. An example subtraction operation described below is performed in association with subtracting an example element B (e.g., [0001]) from an example element A (e.g., [0010]). FIG. 4E is associated with the following pseudocode below.

```
0.   Load elements A, B, Get Temp C, CARRY, B'
1.   B' = ADD Inv(B) with "1"
2.   C = A XOR B'
3.   CARRY = A AND B' and, If Any Bits in CARRY
     True, then
  3a.  SHIFT Down CARRY
  3b.  C = C XOR CARRY
```

Reference number 0 (e.g., "Load elements A, B, Get Temp C, CARRY, B'") of the above pseudocode is associated with loading element A (e.g., [0010]) and element B (e.g., [0001]) as elements A 474 and B 476. In addition, temporary storage rows C 478, CARRY 471, and B' 472 are initialized.

Reference number 1 (e.g., "B'=ADD Inv(B) with '1'") of the above pseudocode is associated with performing an invert operation on element B 476 (e.g., [0001]), adding a "1" value to the inverted element B, and storing as element B' 472. For example, element B 476 (e.g., [0001]) is inverted, resulting in element [1110]. The inverted element [1110] has a value of "1" added to it, resulting in element [1111]. The resulting element [1111] is stored as B' 472 as illustrated at 455-1.

Reference number 2 (e.g., "C=A XOR B'") of the above pseudocode is associated with performing an XOR operation on element A 474 (e.g., [0010]) and element B' 472 (e.g., [1111]) and storing as element C 478. An XOR operation performed on A 474 (e.g., [0010]) and B 476 (e.g., [0001]) results in element [1101], which is stored as C 478, as illustrated at 455-2. Reference number 3 (e.g., "CARRY=A AND B and, If Any Bits in CARRY True, then'") of the above pseudocode is associated with performing an AND operation on element A (e.g., [0010]) and B' 476 (e.g., [1111]), resulting in [0010] being stored as CARRY 471, as illustrated at 455-3. In addition, reference number 3 of the above pseudocode is associated with performing a loop as long as a BlockOR operation determines CARRY 471 (e.g., [0010] at 455-3) includes a particular bit (e.g., a "1" bit). Performing a BlockOR operation on CARRY 471 (e.g., [0010]) determines that CARRY 471 includes the particular bit (e.g., a "1") and therefore the loop can continue.

Reference number 3*a* (e.g., "SHIFT Down CARRY") of the above pseudocode includes, during a first iteration of the loop, performing a SHIFT operation (e.g., shift down, or to the left, one position) on CARRY 471. CARRY 471 (e.g., [0010]) is shifted down one position (e.g., shifted one position to the left), resulting in [0100], as illustrated at 455-3.1*a*. Reference number 3*b* (e.g., "C=C XOR CARRY") of the above pseudocode is associated with performing an XOR operation on C 478 (e.g., [1101]) and CARRY 471 (e.g., [0100]), resulting in [1001] as C 478, as illustrated at 455-3.1*b*.

During a second iteration of the loop, a BlockOR is performed on CARRY 471 (e.g., [0100]) and a determination that CARRY 471 includes the particular bit (e.g., a "1") is performed. A second iteration of reference number 3*a* includes shifting CARRY 471 (e.g., [0100]) down one position, resulting in [1000], as illustrated at 455-3.2*a*. Reference number 3*b* includes performing on XOR on C 478 (e.g., [1001]) and CARRY 471 (e.g., [1000]) resulting in [0001] as C 478, as illustrated at 455-3.2*b*.

During a third iteration of the loop, a BlockOR is performed on CARRY 471 (e.g., [1000]) and a determination that CARRY 471 includes the particular bit (e.g., a "1") is performed. A third iteration of reference number 3*a* includes shifting CARRY 471 (e.g., [1000]) down one position, resulting in [0000], as illustrated at 455.3.3*a*. Reference number 3*b* includes performing an XOR on C 478 (e.g., [0010]) and CARRY 471 (e.g., [0000]), resulting in [0010] as C 478, as illustrated at 455-3.3*b*. During a fourth iteration of the loop, a BlockOR is performed on CARRY 471 (e.g., [0000]), which determines that CARRY 471 does not include the particular bit (e.g., a "1") and therefore a fourth iteration does not continue. The result of performing a subtraction operation on A 474 (e.g., [0010]) and B 476 (e.g., [0001]) is [0001], which is stored as C 478 at the conclusion of the operation, as illustrated at 455-3.3*b*.

While the above described example references thirty-two elements each 4-bits in length, examples are not so limited. For example, thirty-two elements 8-bits, 12 bits, 16 bits, etc., in length can be divided. The above described signed division operation can be performed on data stored in memory cells coupled to a sense line and a plurality of access lines (e.g., illustrated as vertical in the above example). The signed division operation can be performed in parallel to increase parallel processing power by processing groups of elements simultaneously without readjusting the data while performing the operations. For instance, if we have 16,384 columns, then we can perform a signed division operation on a number of elements so as to maximize the number of those elements that are divided simultaneously.

The functionality of the sensing circuitry 250-2 of FIG. 2A is described below and summarized in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
| --- | --- | --- |
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 and/or 205-2).

Figure 5A:
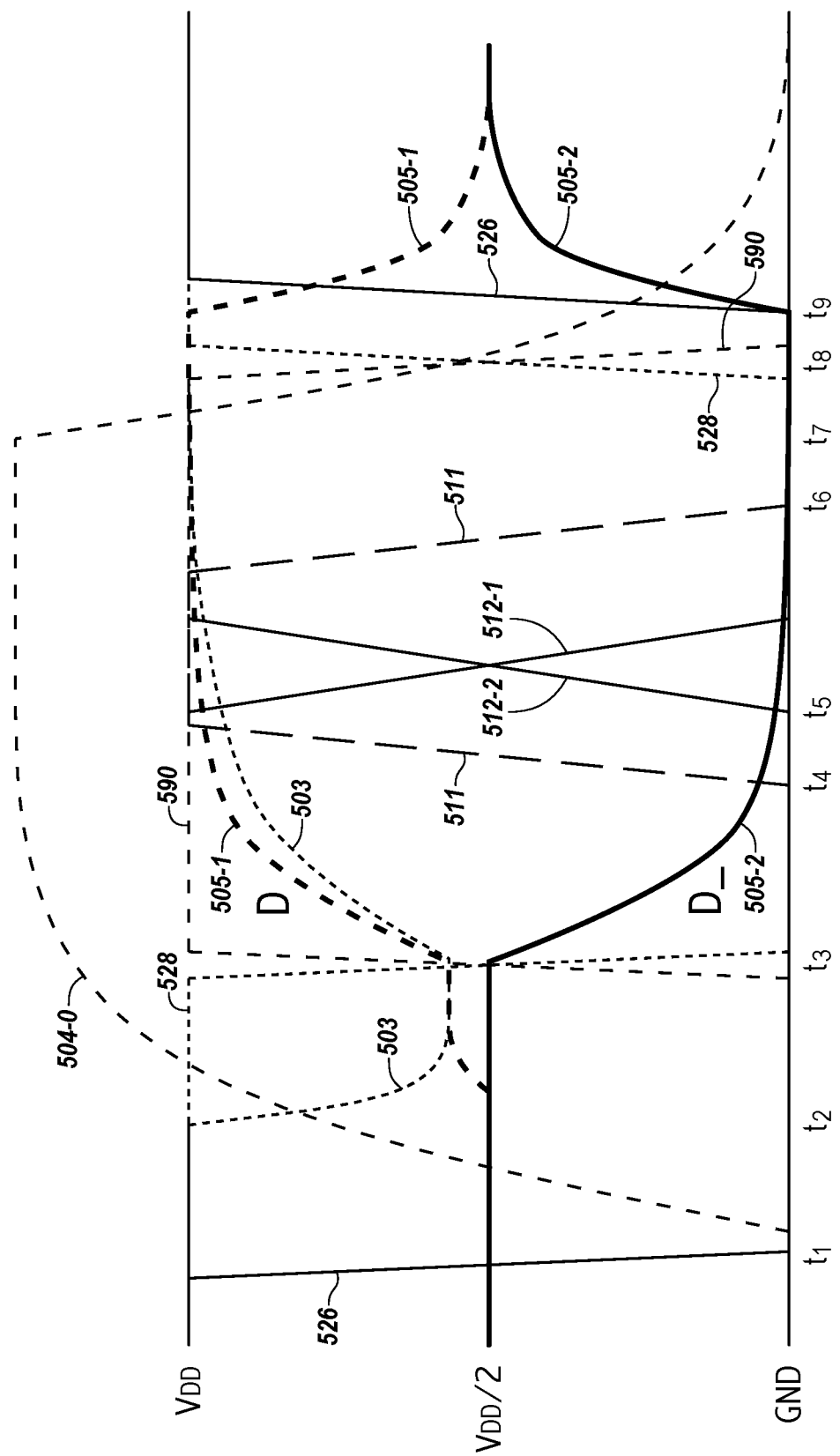
FIGS. 5A-5D illustrate timing diagrams associated with performing a number of logical operations using sensing circuitry in accordance with a number of embodiments of the present disclosure.

FIG. 5A illustrates a timing diagram associated with performing a number of logical operations using sensing circuitry in accordance with a number of embodiments of the present disclosure. The functionality of the sensing circuitry 250-2 of FIG. 2A is described below with respect to performing logical operations and initially storing a result in the compute component 231-2 (e.g., secondary latch of the accumulator). The timing diagram shown in FIG. 5A illustrates signals (e.g., voltage signals) associated with performing a first operation phase of a logical operation (e.g., an R-input logical operation) using the sensing circuitry illustrated in FIG. 2A. The first operation phase described with respect to FIG. 5A can be a first operation phase of an AND, NAND, OR, or NOR operation, for instance. Performing the operation phase illustrated in FIG. 5A can involve consuming significantly less energy (e.g., about half) than previous processing approaches that may involve providing a full swing between voltage rails (e.g., between a supply and ground for accessing I/O lines).

In the example illustrated in FIG. 5*a*, the voltage rails corresponding to complementary logic values (e.g., "1" and "0") are a supply voltage ($V_{DD}$) and a reference voltage (e.g., ground (Gnd)). Prior to performing a logical operation, an equilibration can occur such that the complementary data lines D and D_ are shorted together at an equilibration voltage ($V_{DD}/2$), as previously described.

The first operation phase of a logical operation described below involves loading a first operand of the logical operation into the accumulator. The time references (e.g., $t_1$, etc.) shown in FIG. 5A do not necessarily represent a same absolute or relative time as similar time references in other timing diagrams.

At time $t_1$, the equilibration signal 526 is deactivated, and then a selected row is enabled (e.g., the row corresponding to a memory cell whose data value is to be sensed and used as a first input). Signal 504-0 represents the voltage signal applied to the selected row (e.g., Row Y 204-Y shown in FIG. 2A). When row signal 504-0 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 shown in FIG. 2A if the cell is a 1 T1C DRAM cell), which creates a differential voltage signal between the data lines D and D_ (e.g., as indicated by signals 505-1 and 505-2 on the data lines, respectively) between times $t_2$ and $t_3$. The voltage of the selected cell is represented by signal 503. Due to conservation of energy, creating the differential signal between data lines D and D_ (e.g., by coupling the cell to data line D) does not consume energy. However, the energy associated with enabling/disabling the row signal 504-0 is distributed over the plurality of memory cells coupled to the row.

At time $t_3$, the sense amplifier (e.g., 206-2 shown in FIG. 2A) is enabled. As shown, a positive control signal 590, e.g., corresponding to ACT 265 shown in FIG. 2B, goes high and the negative control signal 528, e.g., corresponding to RnIF 228 shown in FIG. 2B, goes low. This amplifies the differential signal between data lines D and D_, resulting in a voltage (e.g., $V_{DD}$) corresponding to a logic "1" or a voltage (e.g., ground) corresponding to a logic "0" being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$. FIG. 5A shows, in example, the data line voltages 505-1 and 505-2 that correspond to a logic "1" being on data line D.

According to some embodiments, the primary latch of sense amplifier 206-2 can be coupled to the complementary data lines D and D_ through respective pass transistors (not shown in FIG. 2A but in a similar configuration as the manner in which latch 264 is coupled to the data lines D and D_ through load/pass transistors 218-1 and 218-2 shown in FIG. 2A). The Passd control signal 511 controls one pass transistor. The Passdb control signal controls the other pass transistor, and here the Passdb control signal can behave here the same as the Passd control signal.

At time $t_4$, the pass transistors (if present) can be enabled (e.g., via respective Passd and Passdb control signals 511 applied to control lines coupled to the respective gates of the pass transistors going high). At time $t_5$, the accumulator negative control signal 512-1 (e.g., Accumb) and the accumulator positive control signal 512-2 (e.g., Accum) are activated via respective control lines 212-1 and 212-2 shown in FIG. 2A. As described below, the accumulator control signals ACCUMB 512-1 and ACCUM 512-2 may remain activated for subsequent operation phases. As such, in this example, activating the control signals ACCUMB 512-1 and ACCUM 512-2 enables the secondary latch (e.g., accumulator) of compute component 231-2 shown in FIG. 2A. The sensed data value stored in sense amplifier 206-2 is transferred (e.g., copied) to the secondary latch, including the dynamic latch and static latch 264, as shown in FIG. 2A.

At time $t_6$, the Passd control signal 511 (and the Passdb control signal) goes low thereby turning off the pass transistors (if present). However, since the accumulator control signals ACCUMB 512-1 and ACCUM 512-2 remain activated, an accumulated result is stored (e.g., latched) in the secondary latches (e.g., accumulator). At time $t_7$, the row signal 504-0 is deactivated, and the array sense amps are disabled at time is (e.g., sense amplifier control signals 528 and 590 are deactivated).

At time $t_9$, the data lines D and D_ are equilibrated (e.g., equilibration signal 526 is activated), as illustrated by data line voltage signals 505-1 and 505-2 moving from their respective rail values to the equilibration voltage ($V_{DD}/2$). The equilibration consumes little energy due to the law of conservation of energy. As described above in association with FIG. 2B, equilibration can involve shorting the complementary data lines D and D_ together at an equilibration voltage, which is $V_{DD}/2$, in this example. Equilibration can occur, for instance, prior to a memory cell sensing operation.

Figure 5B:
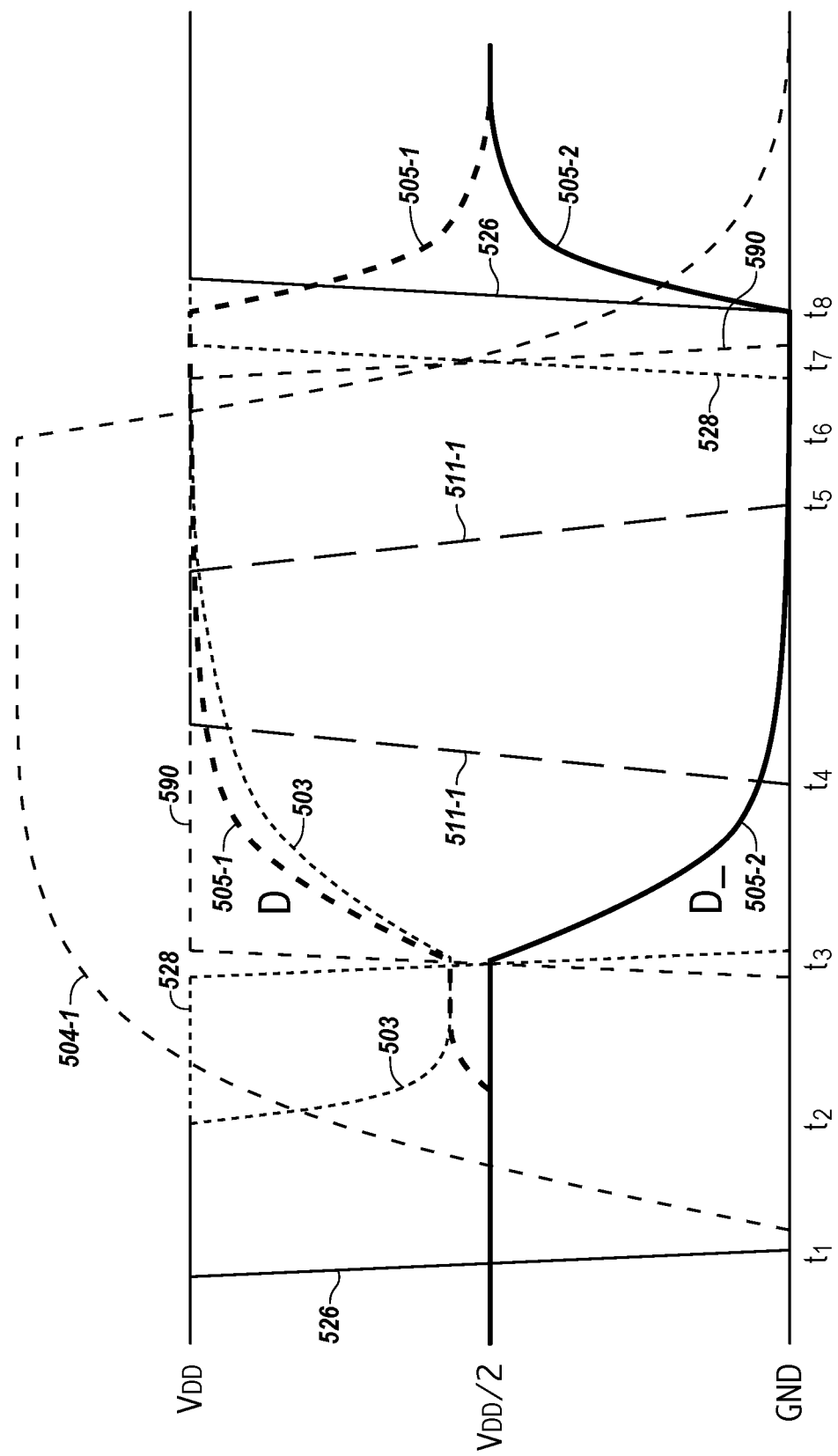
Figure 5C:
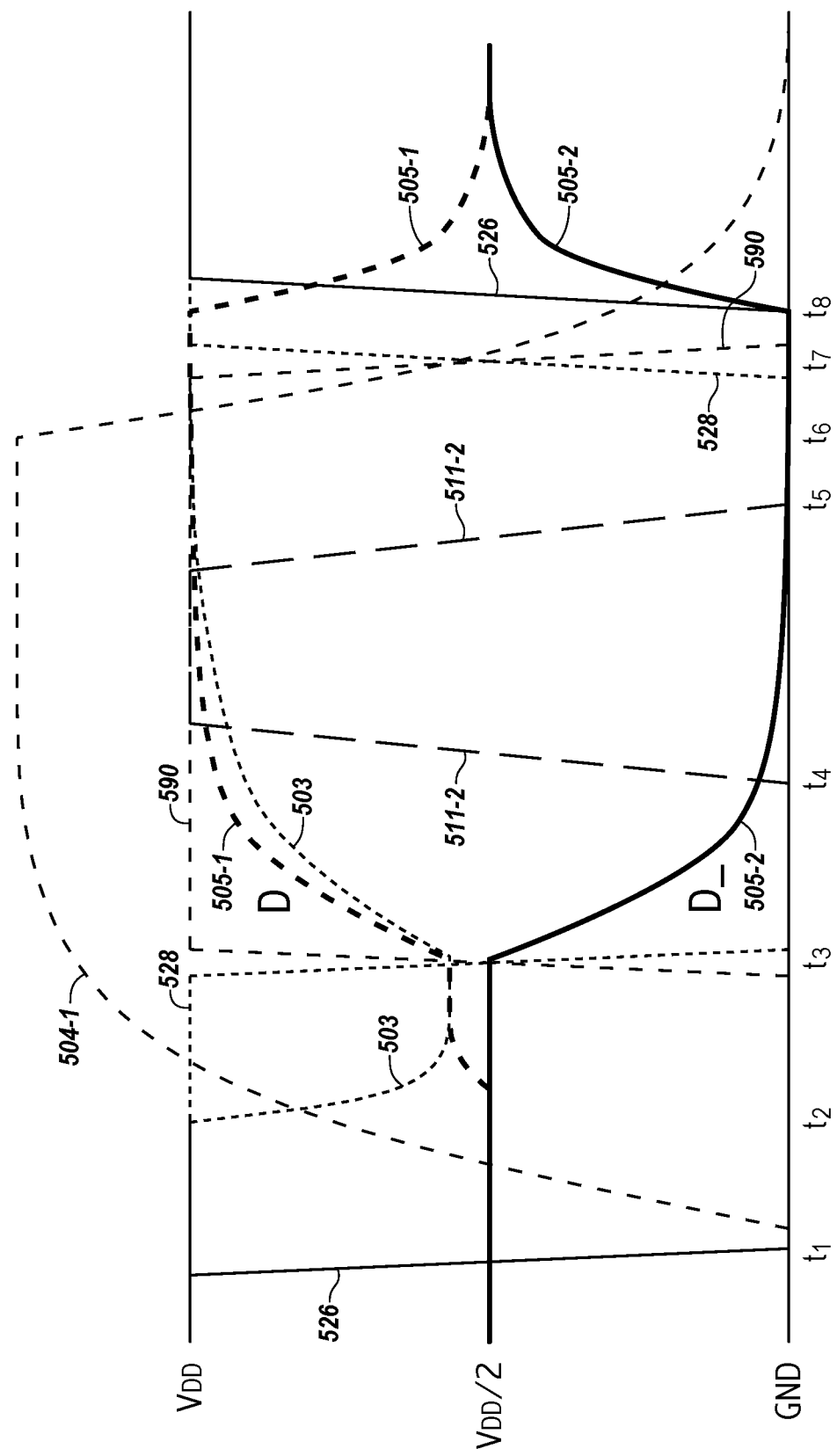

FIGS. 5B and 5C respectively illustrate timing diagrams associated with performing a number of logical operations using sensing circuitry in accordance with a number of embodiments of the present disclosure. Timing diagrams shown in FIGS. 5B and 5C illustrate signals (e.g., voltage signals) associated with performing a number of intermediate operation phases of a logical operation (e.g., an R-input logical operation). For instance, timing diagram shown in FIG. 5B corresponds to a number of intermediate operation phases of an R-input NAND operation or an R-input AND operation, and timing diagram shown in FIG. 5C corresponds to a number of intermediate operation phases of an R-input NOR operation or an R-input OR operation. For example, performing an AND or NAND operation can include performing the operation phase shown in FIG. 5B one or more times subsequent to an initial operation phase such as that described with respect to FIG. 5A. Similarly, performing an OR or NOR operation can include performing the operation phase shown and described with respect to FIG. 5C one or more times subsequent to an initial operation phase such as that described with respect to FIG. 5A.

As shown in the timing diagrams illustrated in FIGS. 5B and 5C, at time $t_1$, equilibration is disabled (e.g., the equilibration signal 526 is deactivated), and then a selected row is enabled (e.g., the row corresponding to a memory cell whose data value is to be sensed and used as an input such as a second input, third input, etc.). Signal 504-1 represents the voltage signal applied to the selected row (e.g., Row Y 204-Y shown in FIG. 2A). When row signal 504-1 reaches the threshold voltage (Vt) of the access transistor (e.g., 202-3 shown in FIG. 2A) corresponding to the selected cell, the access transistor turns on and couples the data line D to the selected memory cell (e.g., to the capacitor 203-3 if the cell is a 1T1C DRAM cell), which creates a differential voltage signal between the data lines D and D_ (e.g., as indicated by signals 505-1 and 505-2, respectively) between times $t_2$ and $t_3$. The voltage of the selected cell is represented by signal 503. Due to conservation of energy, creating the differential signal between D and D_ (e.g., by coupling the cell to data line D) does not consume energy. However, the energy associated with activating/deactivating the row signal 504-1 can be amortized over the plurality of memory cells coupled to the row.

At time $t_3$, the sense amplifier (e.g., 206-2 shown in FIG. 2A) is enabled (e.g., a positive control signal 590 (e.g., corresponding to ACT 233 shown in FIG. 2B) goes high, and the negative control signal 528 (e.g., RnIF 228 shown in FIG. 2B) goes low). This amplifies the differential signal between D and D_, resulting in a voltage (e.g., $V_{DD}$) corresponding to a logic 1 or a voltage (e.g., ground) corresponding to a logic 0 being on data line D (and the other voltage being on complementary data line D_). As such, the sensed data value is stored in the primary latch of sense amplifier 206-2. The primary energy consumption occurs in charging the data line D (205-1) from the equilibration voltage $V_{DD}/2$ to the rail voltage $V_{DD}$.

As shown in timing diagrams illustrated in FIGS. 5B and 5C, at time $t_4$ (e.g., after the selected cell is sensed), only one of control signals 511-1 (Passd) shown in FIG. 5B and 511-2 (Passdb) shown in FIG. 5C is activated (e.g., only one of pass transistors (if present) is enabled), depending on the particular logic operation. For example, since the timing diagram illustrated in FIG. 5B corresponds to an intermediate phase of a NAND or AND operation, control signal 511-1 (Passd) is activated at time t4 to turn on the pass transistor coupling the primary latch to data line D and the Passdb control signal remains deactivated leaving the pass transistor coupling the primary latch to data line D_ turned off. Conversely, since the timing diagram illustrated in FIG. 5C corresponds to an intermediate phase of a NOR or OR operation, control signal 511-2 (Passdb) is activated at time t4 to turn on the pass transistor coupling the primary latch to data line D_ and control signal Passd remains deactivated leaving the pass transistor coupling the primary latch to data line D turned off. Recall from above that the accumulator control signals 512-1 (Accumb) and 512-2 (Accum) were activated during the initial operation phase described with respect to FIG. 5A, and they remain activated during the intermediate operation phase(s).

Since the accumulator was previously enabled, activating only Passd (511-1 as shown in FIG. 5B) results in accumulating the data value corresponding to the voltage signal 505-1 shown in FIG. 5B corresponding to data line D. Similarly, activating only Passdb (511-2 as shown in FIG. 5C) results in accumulating the data value corresponding to the voltage signal 505-2 corresponding to data line D_. For instance, in an example AND/NAND operation shown in the timing diagram illustrated in FIG. 5B in which only Passd (511-1) is activated, if the data value stored in a second selected memory cell is a logic "0," then the accumulated value associated with the secondary latch is asserted low such that the secondary latch stores logic "0." If the data value stored in the second selected memory cell is not a logic"0," then the secondary latch retains its stored first selected memory cell data value (e.g., a logic "1" or a logic "0"). As such, in this AND/NAND operation example, the secondary latch is serving as a zeroes (0s) accumulator.

Similarly, in an example OR/NOR operation shown in the timing diagram illustrated in FIG. 5C in which only Passdb 511-2 is activated, if the data value stored in the second selected memory cell is a logic "1," then the accumulated value associated with the secondary latch is asserted high such that the secondary latch stores logic "1." If the data value stored in the second selected memory cell is not a logic "1," then the secondary latch retains its stored first selected memory cell data value (e.g., a logic "1" or a logic "0"). As such, in this OR/NOR operation example, the secondary latch is effectively serving as a ones (1s) accumulator since voltage signal 505-2 on D_ is setting the true, e.g., "1", data value of the accumulator.

At the conclusion of an intermediate operation phase such as that shown in FIG. 5B or 5C, the Passd signal 511-1 (e.g., for AND/NAND) or the Passdb signal 511-2 (e.g., for OR/NOR) is deactivated (e.g., at time t5), the selected row is disabled (e.g., at time t6), the sense amplifier is disabled (e.g., at time t7), and equilibration occurs (e.g., at time t8). An intermediate operation phase such as that illustrated in FIG. 5B or 5C can be repeated in order to accumulate results from a number of additional rows. As an example, the sequence of timing diagram illustrated in FIG. 5B and/or 5C can be performed a subsequent (e.g., second) time for a third memory cell, a subsequent (e.g., third) time for a fourth memory cell, etc. For instance, for a 10-input NOR operation, the intermediate phase shown in FIG. 5C can occur 9 times to provide 9 inputs of the 10-input logical operation, with the tenth input being determined during the initial operation phase (e.g., as described with respect to FIG. 5A).

Figure 5D:
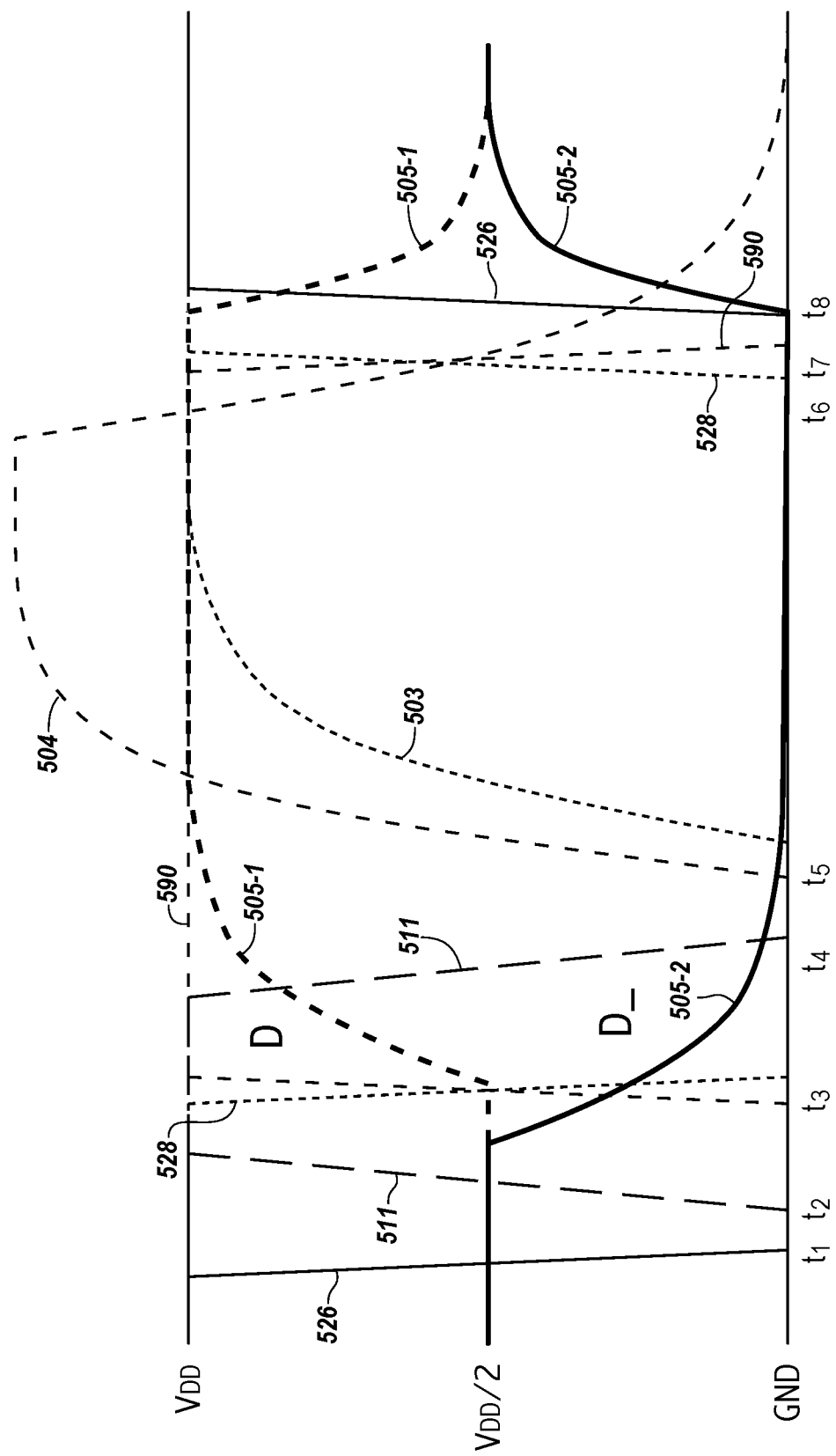

FIG. 5D illustrates a timing diagram associated with performing a number of logical operations using sensing circuitry in accordance with a number of embodiments of the present disclosure. The timing diagram illustrated in FIG. 5D shows signals (e.g., voltage signals) associated with performing a last operation phase of a logical operation (e.g., an R-input logical operation). For instance, the timing diagram illustrated in FIG. 5D corresponds to a last operation phase of an R-input AND operation or an R-input OR operation.

For example, performing a last operation phase of an R-input can include performing the operation phase shown in FIG. 5D subsequent to a number of iterations of the intermediate operation phase(s) described in association with FIGS. 5B and/or 5C. Table 2 shown below indicates the Figures corresponding to the sequence of operation phases associated with performing a number of R-input logical operations in accordance with a number of embodiments described herein.

TABLE 2

| Operation | FIG. 5A | FIG. 5B | FIG. 5C | FIG. 5D |
|---|---|---|---|---|
| AND | First phase | R-1 iterations | | Last phase |
| NAND | First phase | R-1 iterations | | |
| OR | First phase | | R-1 iterations | Last phase |
| NOR | First phase | | R-1 iterations | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phase illustrated in the timing diagram of FIG. 5D is described in association with storing a result of an R-input logical operation to a row of the array (e.g., array 230 shown in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagram illustrated in FIG. 5D, at time equilibration is disabled (e.g., the equilibration signal 526 is deactivated) such that data lines D and D_ are floating. At time t2, the Passd control signal 511 (and Passdb signal) is activated for an AND or OR operation.

Activating the Passd control signal 511 (and Passdb signal) (e.g., in association with an AND or OR operation) transfers the accumulated output stored in the secondary latch of compute component 231-2 shown in FIG. 2A to the primary latch of sense amplifier 206-2. For instance, for an AND operation, if any of the memory cells sensed in the prior operation phases (e.g., the first operation phase illustrated in FIG. 5A and one or more iterations of the intermediate operation phase illustrated in FIG. 5B) stored a logic "0" (e.g., if any of the R-inputs of the AND operation were a logic "0"), then the data line D_ will carry a voltage corresponding to logic "1" (e.g., $V_{DD}$) and data line D will carry a voltage corresponding to logic "0" (e.g., ground). For this AND operation example, if all of the memory cells sensed in the prior operation phases stored a logic "1" (e.g., all of the R-inputs of the AND operation were logic "1"), then the data line D_ will carry a voltage corresponding to logic "0" and data line D will carry a voltage corresponding to logic "1". At time t3, the primary latch of sense amplifier 206-2 is then enabled (e.g., a positive control signal 590 (e.g., corresponding to ACT 265 shown in FIG. 2B) goes high and the negative control signal 528 (e.g., corresponding to RnIF 228 shown in FIG. 2B) goes low), which amplifies the differential signal between data lines D and D_ such that the data line D now carries the ANDed result of the respective input data values as determined from the memory cells sensed during the prior operation phases. As such, data line D will be at ground if any of the input data values are a logic "0" and data line D will be at $V_{DD}$ if all of the input data values are a logic "1."

For an OR operation, if any of the memory cells sensed in the prior operation phases (e.g., the first operation phase of FIG. 5A and one or more iterations of the intermediate operation phase shown in FIG. 5C) stored a logic "1" (e.g., if any of the R-inputs of the OR operation were a logic "1"), then the data line D_ will carry a voltage corresponding to logic "0" (e.g., ground) and data line D will carry a voltage corresponding to logic "1" (e.g., $V_{DD}$). For this OR example, if all of the memory cells sensed in the prior operation phases stored a logic "0" (e.g., all of the R-inputs of the OR operation were logic "0"), then the data line D will carry a voltage corresponding to logic "0" and data line D_ will carry a voltage corresponding to logic "1." At time t3, the primary latch of sense amplifier 206-2 is then enabled and the data line D now carries the ORed result of the respective input data values as determined from the memory cells sensed during the prior operation phases. As such, data line D will be at $V_{DD}$ if any of the input data values are a logic "1" and data line D will be at ground if all of the input data values are a logic "0."

The result of the R-input AND or OR logical operations can then be stored back to a memory cell of array 230 shown in FIG. 2A. In the examples shown in FIG. 5D, the result of the R-input logical operation is stored to a memory cell coupled to the last row enabled (e.g., row of the last logical operation operand). Storing the result of the logical operation to a memory cell simply involves enabling the associated row access transistor by enabling the particular row. The capacitor of the memory cell will be driven to a voltage corresponding to the data value on the data line D (e.g., logic "1" or logic "0"), which essentially overwrites whatever data value was previously stored in the selected memory cell. It is noted that the selected memory cell can be a same memory cell that stored a data value used as an input for the logical operation. For instance, the result of the logical operation can be stored back to a memory cell that stored an operand of the logical operation.

The timing diagram illustrated in FIG. 5D show, at time t3, the positive control signal 590 and the negative control signal 528 being deactivated (e.g., signal 590 goes high and signal 528 goes low) to disable the sense amplifier 206-2 shown in FIG. 2A. At time t4 the Passd control signal 511 (and Passdb signal) that was activated at time t2 is deactivated. Embodiments are not limited to this example. For instance, in a number of embodiments, the sense amplifier 206-2 shown in FIG. 2A may be enabled subsequent to time t4 (e.g., after the Passd control signal 511 (and Passdb signal) are deactivated).

As shown in FIG. 5D, at time t5, a selected row is enabled (e.g., by row activation signal 504 going high, which drives the capacitor of the selected cell to the voltage corresponding to the logic value stored in the accumulator. At time t6 the selected row is disabled. At time t7 the sense amplifier 206-2 shown in FIG. 2A is disabled (e.g., positive control signal 528 and negative control signal 590 are deactivated in FIG. 5D), and at time t8 equilibration occurs (e.g., signal 526 is activated and the voltages on the complementary data lines 505-1 (D) and 505-2 (D_) are brought to the equilibration voltage, as shown in FIG. 5D).

Although the example of performing a last operation phase of an R-input was discussed above with respect to FIG. 5D for performing AND and OR logical operations, embodiments are not limited to these logical operations. For example, the NAND and NOR operations can also involve a last operation phase of an R-input that is stored back to a memory cell of array 230 using control signals to operate the sensing circuitry illustrated in FIG. 2A.

The functionality of the sensing circuitry 250-2 of FIG. 2A as described previously and summarized once again in Table 1 below with respect to performing logical operations and initially storing a result in the sense amplifier 206-2. Initially storing the result of a particular logical operation in the primary latch of sense amplifier 206-2 can provide improved versatility as compared to previous approaches in which the result may initially reside in a secondary latch (e.g., accumulator) of a compute component 231-2, and then be subsequently transferred to the sense amplifier 206-2, for instance.

TABLE 1

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 206-2 (e.g., without having to perform an additional operation to move the result from the compute component 231-2 (e.g., accumulator) to the sense amplifier 206-2) is advantageous because, for instance, the result can be written to a row (of the array of memory cells) or back into the accumulator without performing a precharge cycle (e.g., on the complementary data lines 205-1 (D) and/or 205-2 (D_)).

Figure 6A:
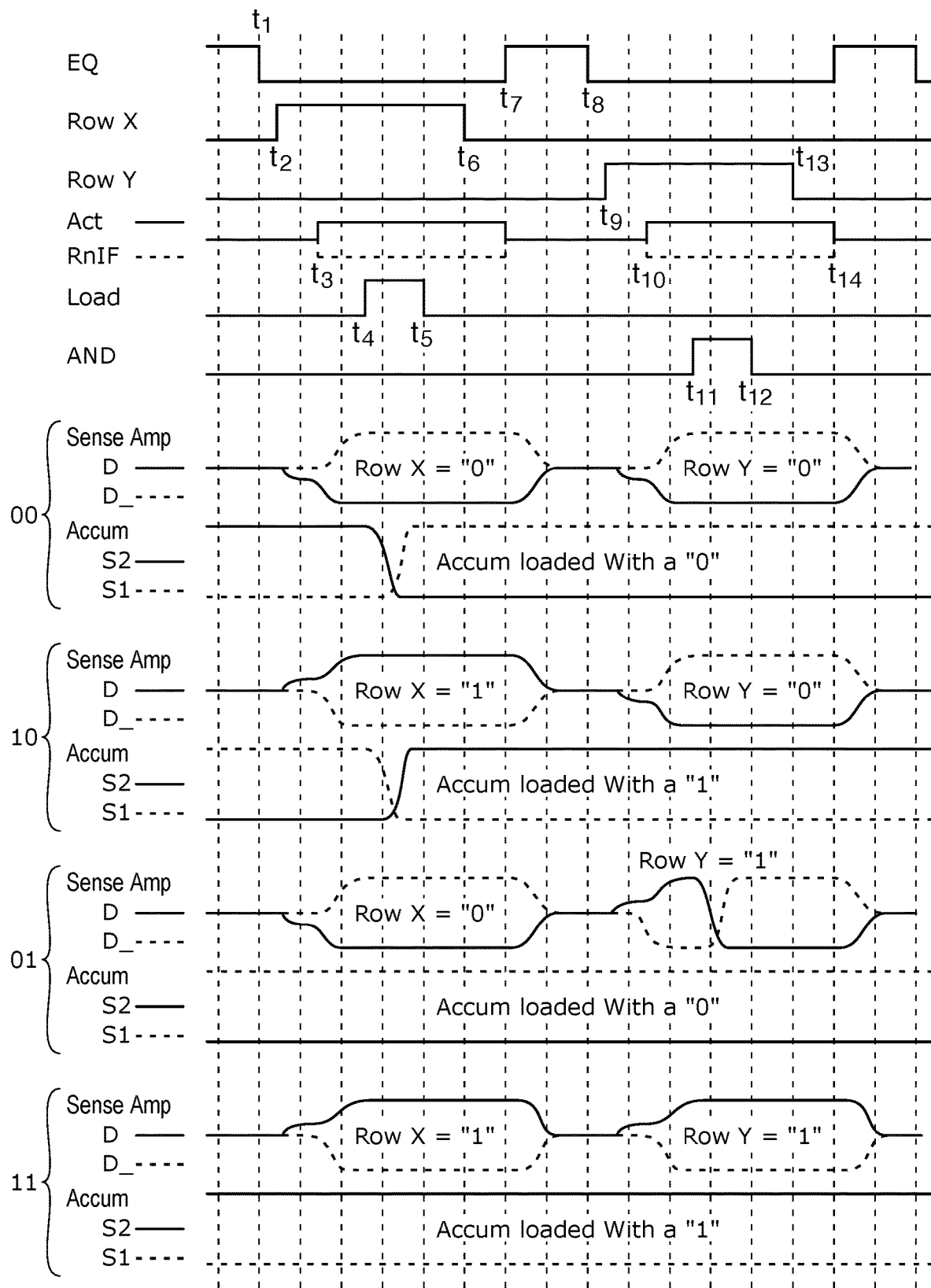
FIGS. 6A-6B illustrate timing diagrams associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation on a first operand and a second operand. In this example, the first operand is stored in a memory cell coupled to a first access line (e.g., ROW X) and the second operand is stored in a memory cell coupled to a second access line (e.g., ROW Y). Although the example refers to performing an AND on data stored in cells corresponding to one particular column, embodiments are not so limited. For instance, an entire row of data values can be ANDed, in parallel, with a different row of data values. For example, if an array comprises 2,048 columns, then 2,048 AND operations could be performed in parallel.

FIG. 6A illustrates a number of control signals associated with operating sensing circuitry (e.g., 250-2 in FIG. 2A) to perform the AND logical operation. "EQ" corresponds to an equilibrate signal applied to the sense amp 206-2, "ROW X" corresponds to an activation signal applied to access line 204-X, "ROW Y" corresponds to an activation signal applied to access line 204-Y, "Act" and "RnIF" correspond to a respective active positive and negative control signal applied to the sense amp 206-2, "LOAD" corresponds to a load control signal (e.g., LOAD/PASSD and LOAD/PASSDb shown in FIG. 2A), and "AND" corresponds to the AND control signal shown in FIG. 2A. FIG. 6A also illustrates the waveform diagrams showing the signals (e.g., voltage signals) on the digit lines D and D corresponding to sense amp 206-2 and on the nodes S1 and S2 corresponding to the compute component 231-2 (e.g., accumulator) during an AND logical operation for the various data value combinations of the Row X and Row Y data values (e.g., diagrams correspond to respective data value combinations 00, 10, 01, 11). The particular timing diagram waveforms are discussed below with respect to the pseudo code associated with an AND operation of the circuit shown in FIG. 2A.

An example of pseudo code associated with loading (e.g., copying) a first data value stored in a cell coupled to row 204-X into the accumulator can be summarized as follows:

Copy Row X into the Accumulator:
    Deactivate EQ;
    Open Row X;
    Fire Sense Amps (after which Row X data resides in the sense amps);
    Activate LOAD (sense amplifier data (Row X) is transferred to nodes S1 and S2 of the Accumulator and resides there dynamically);
    Deactivate LOAD;
    Close Row X;
    Precharge;

In the pseudo code above, "Deactivate EQ" indicates that an equilibration signal (EQ signal shown in FIG. 6A) corresponding to the sense amplifier 206-2 is disabled at $t_1$ as shown in FIG. 6A (e.g., such that the complementary data lines (e.g., 205-1 (D) and 205-2 (D_) are no longer shorted to $V_{DD}/2$). After equilibration is disabled, a selected row (e.g., ROW X) is enabled (e.g., selected, opened such as by activating a signal to select a particular row) as indicated by "Open Row X" in the pseudo code and shown at t2 for signal Row X in FIG. 6A. When the voltage signal applied to ROW X reaches the threshold voltage (Vt) of the access transistor (e.g., 202-4) corresponding to the selected cell, the access transistor turns on and couples the data line (e.g., 205-2

(D_)) to the selected cell (e.g., to capacitor 203-4) which creates a differential voltage signal between the data lines.

After Row X is enabled, in the pseudo code above, "Fire Sense Amps" indicates that the sense amplifier 206-2 is enabled to set the primary latch, as has been described herein, and subsequently disabled. For example, as shown at t3 in FIG. 6A, the ACT positive control signal (e.g., 265 shown in FIG. 2B) goes high and the RnIF negative control signal (e.g., 228 shown in FIG. 2B) goes low, which amplifies the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic is placed on the complementary data line 205-2 (D_). The sensed data value is stored in the primary latch of sense amplifier 206-2. The primary energy consumption occurs in charging the data lines (e.g., 205-1 (D) or 205-2 (D_)) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amp. It should be noted that FIG. 2A shows that the memory cell including storage element 203-4, corresponding to Row X, is coupled to the complementary data line D_, while the memory cell including storage element 203-3, corresponding to Row Y, is coupled to data line D. However, as can be seen in FIG. 2A, the charge stored in memory cell 201-4 (corresponding to Row X) corresponding to a "0" data value causes the voltage on data line D_ (to which memory cell 201-4 is coupled) to go high and the charge stored in memory cell 201-4 corresponding to a "1" data value causes the voltage on data line D_ to go low, which is opposite correspondence between data states and charge stored in memory cell 201-4, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 218-1 and 218-2 to conduct. In this manner, activating the LOAD control signal enables the secondary latch in the accumulator of the compute component 231-2. The sensed data value stored in the sense amplifier 206-2 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 205-1 (D) and 205-2 (D_) in FIG. 2A) in the pseudo code above, "Deactivate LOAD" indicates that the LOAD control signal goes back low as shown at $t_5$ in FIG. 6A to cause the load/pass transistors 218-1 and 218-2 to stop conducting and thereby isolate the dynamic latch from the complementary data lines. However, the data value remains dynamically stored in secondary latch of the accumulator.

After storing the data value on the secondary latch, the selected row (e.g., ROW X) is disabled (e.g., deselected, closed such as by deactivating a select signal for a particular row) as indicated by "Close Row X" and indicated at t6 in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206-2 and the secondary latch of the compute component 231-2 shown in FIG. 2A) and the second data value (stored in a memory cell 201-3 coupled to Row Y 204-Y) includes performing particular steps which depend on the whether an AND or an OR is to be performed. Examples of pseudo code associated with "ANDing" and "ORing" the data value residing in the accumulator (e.g., the first data value stored in the memory cell 201-4 coupled to Row X 204-X) and the second data value (e.g., the data value stored in the memory cell 201-3 coupled to Row Y 204-Y) are summarized below. Example pseudo code associated with "ANDing" the data values can include:

Deactivate EQ;
Open Row Y;
Fire Sense Amps (after which Row Y data resides in the sense amps);
Close Row Y;
The result of the logic operation, in the next operation, will be placed on the sense amp, which will overwrite any row that is active.
Even when Row Y is closed, the sense amplifier still contains the Row Y data value.
Activate AND;
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0";
If the accumulator contains a "1" (i.e., a voltage corresponding to a "1" on node S2 and a voltage corresponding to a "0" on node S1), the sense amplifier data remains unchanged (Row Y data);
This operation leaves the data in the accumulator unchanged.
Deactivate AND;
Precharge;

In the pseudo code above, "Deactivate EQ" indicates that an equilibration signal corresponding to the sense amplifier 206-2 is disabled (e.g., such that the complementary data lines 205-1 (D) and 205-2 (D_) are no longer shorted to $V_{DD}/2$), which is illustrated in FIG. 6A at $t_8$. After equilibration is disabled, a selected row (e.g., ROW Y) is enabled as indicated in the pseudo code above by "Open Row Y" and shown in FIG. 6A at $t_9$. When the voltage signal applied to ROW Y reaches the threshold voltage (Vt) of the access transistor (e.g., 202-3) corresponding to the selected cell, the access transistor turns on and couples the data line (e.g., D_ 205-2) to the selected cell (e.g., to capacitor 203-3) which creates a differential voltage signal between the data lines.

After Row Y is enabled, in the pseudo code above, "Fire Sense Amps" indicates that the sense amplifier 206-2 is enabled to amplify the differential signal between 205-1 (D) and 205-2 (D_), resulting in a voltage (e.g., $V_{DD}$) corresponding to a logic 1 or a voltage (e.g., GND) corresponding to a logic 0 being on data line 205-1 (D). The voltage corresponding to the other logic state is on complementary data line 205-2 (D_). As shown at $t_{10}$ in FIG. 6A, the ACT positive control signal (e.g., 265 shown in FIG. 2B) goes high and the RnIF negative control signal (e.g., 228 shown in FIG. 2B) goes low to fire the sense amps. The sensed data value from memory cell 201-3 is stored in the primary latch of sense amplifier 206-2, as previously described. The secondary latch still corresponds to the data value from memory cell 201-4 since the dynamic latch is unchanged.

After the second data value sensed from the memory cell 201-3 coupled to Row Y is stored in the primary latch of sense amplifier 206-2, in the pseudo code above, "Close Row Y" indicates that the selected row (e.g., ROW Y) can be disabled if it is not desired to store the result of the AND logical operation back in the memory cell corresponding to Row Y. However, FIG. 6A shows that Row Y is left enabled such that the result of the logical operation can be stored back in the memory cell corresponding to Row Y. Isolating the memory cell corresponding to Row Y can be accomplished by the access transistor turning off to decouple the selected cell 201-3 from the data line 205-1 (D).

After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 207-1 to conduct. In this manner, activating the AND control signal causes the value of the function (e.g., Row X AND Row Y) to be written to the sense amp.

With the first data value (e.g., Row X) stored in the dynamic latch of the accumulator 231-2 and the second data value (e.g., Row Y) stored in the sense amplifier 206-2, if the dynamic latch of the compute component 231-2 contains a "0" (i.e., a voltage corresponding to a "0" on node S2 and a voltage corresponding to a "1" on node S1), the sense amplifier data is written to a "0" (regardless of the data value previously stored in the sense amp). This is because the voltage corresponding to a "1" on node S1 causes transistor 209-1 to conduct thereby coupling the sense amplifier 206-2 to ground through transistor 209-1, pass transistor 207-1 and data line 205-1 (D). When either data value of an AND operation is "0," the result is a "0." Here, when the second data value (in the dynamic latch) is a "0," the result of the AND operation is a "0" regardless of the state of the first data value. Thus the configuration of the sensing circuitry causes the "0" result to be written and initially stored in the sense amplifier 206-2. This operation leaves the data value in the accumulator unchanged (e.g., from Row X).

If the secondary latch of the accumulator contains a "1" (e.g., from Row X), then the result of the AND operation depends on the data value stored in the sense amplifier 206-2 (e.g., from Row Y). The result of the AND operation should be a "1" if the data value stored in the sense amplifier 206-2 (e.g., from Row Y) is also a "1," but the result of the AND operation should be a "0" if the data value stored in the sense amplifier 206-2 (e.g., from Row Y) is a "0." The sensing circuitry 250-2 is configured such that if the dynamic latch of the accumulator contains a "1" (i.e., a voltage corresponding to a "1" on node S2 and a voltage corresponding to a "0" on node S1), transistor 209-1 does not conduct, the sense amplifier is not coupled to ground (as described above), and the data value previously stored in the sense amplifier 206-2 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 206-2, "Deactivate AND" in the pseudo code above indicates that the AND control signal goes low as shown at $t_{12}$ in FIG. 6A, causing pass transistor 207-1 to stop conducting to isolate the sense amplifier 206-2 (and data line 205-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal going high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S2 of the secondary latch of the compute component (e.g., 231-2 shown in FIG. 2A) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 2A can be successfully operated by initiating the AND logical operation before starting to load the second operand (e.g., Row Y data value) into the sense amplifier.

Figure 6B:
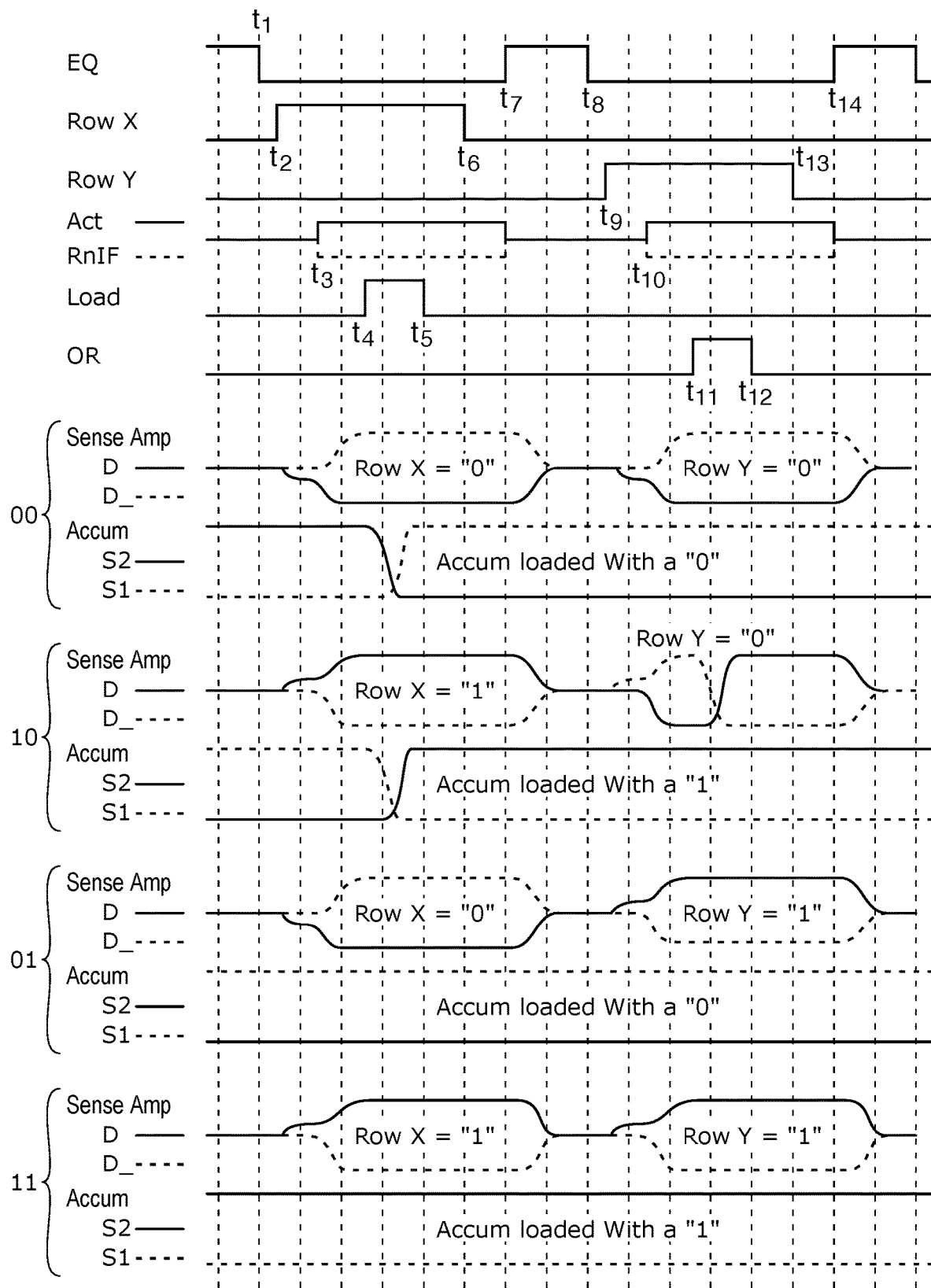

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 2A.

A subsequent operation phase can alternately be associated with performing the OR operation on the first data value (now stored in the sense amplifier 206-2 and the secondary latch of the compute component 231-2) and the second data value (stored in a memory cell 201-3 coupled to Row Y 204-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

Deactivate EQ;
Open Row Y;
Fire Sense Amps (after which Row Y data resides in the sense amps);
Close Row Y;
   When Row Y is closed, the sense amplifier still contains the Row Y data value.
Activate OR;
This results in the sense amplifier being written to the value of the function (e.g., Row X OR Row Y), which may overwrite the data value from Row Y previously stored in the sense amplifier as follows:

If the accumulator contains a "0" (i.e., a voltage corresponding to a "0" on node S2 and a voltage corresponding to a "1" on node S1), the sense amplifier data remains unchanged (Row Y data);

If the accumulator contains a "1" (i.e., a voltage corresponding to a "1" on node S2 and a voltage corresponding to a "0" on node S1), the sense amplifier data is written to a "1";

This operation leaves the data in the accumulator unchanged.

Deactivate OR;
Precharge;

The "Deactivate EQ" (shown at $t_8$ in FIG. 6B), "Open Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., enabled if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 207-2 to conduct. In this manner, activating the OR control signal causes the value of the function (e.g., Row X OR Row Y) to be written to the sense amp.

With the first data value (e.g., Row X) stored in the secondary latch of the compute component 231-2 and the second data value (e.g., Row Y) stored in the sense amplifier 206-2, if the dynamic latch of the accumulator contains a "0" (i.e., a voltage corresponding to a "0" on node S2 and a voltage corresponding to a "1" on node S1), then the result of the OR operation depends on the data value stored in the sense amplifier 206-2 (e.g., from Row Y). The result of the OR operation should be a "1" if the data value stored in the sense amplifier 206-2 (e.g., from Row Y) is a "1," but the result of the OR operation should be a "0" if the data value stored in the sense amplifier 206-2 (e.g., from Row Y) is also a "0." The sensing circuitry 250-2 is configured such that if the dynamic latch of the accumulator contains a "0," with the voltage corresponding to a "0" on node S2, transistor 209-2 is off and does not conduct (and pass transistor 207-1 is also off since the AND control signal is not asserted) so the sense amplifier 206-2 is not coupled to ground (either side), and the data value previously stored in the sense amplifier 206-2 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 209-2 does conduct (as does pass transistor 207-2 since the OR control signal is asserted), and the sense amplifier 206-2 input coupled to data line 205-2 (D_) is coupled to ground since the voltage corresponding to a "1" on node S2 causes transistor 209-2 to conduct along with pass transistor 207-2 (which also conducts since the OR control signal is asserted). In this manner, a "1" is initially stored in the sense amplifier 206-2 as a result of the OR operation when the secondary latch of the accumulator contains a "1" regardless of the data value previously stored in the sense amp. This operation leaves the data in the accumulator unchanged. FIG. 6B shows, in the alternative, the behavior of voltage signals on the data lines (e.g., 205-1 (D) and 205-2 (D_) shown in FIG. 2A) coupled to the sense amplifier (e.g., 206-2 shown in FIG. 2A) and the behavior of voltage signals on nodes S1 and S2 of the secondary latch of the compute component 231-2 for an OR logical operation involving each of the possible combination of operands (e.g., Row X/Row Y data values 00, 10, 01, and 11).

After the result of the OR operation is initially stored in the sense amplifier 206-2, "Deactivate OR" in the pseudo code above indicates that the OR control signal goes low as shown at $t_{12}$ in FIG. 6B, causing pass transistor 207-2 to stop conducting to isolate the sense amplifier 206-2 (and data line D 205-2) from ground. If not previously done, Row Y can be closed (as shown at $t_{13}$ in FIG. 6B) and the sense amplifier can be disabled (as shown at $t_{14}$ in FIG. 4 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 250-2 illustrated in FIG. 2A can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORinv control signal can be asserted instead of the OR control signal. Activating the ORinv control signal causes transistor 214-2 to conduct and activating the ANDinv control signal causes transistor 214-1 to conduct. In each case, asserting the appropriate inverted control signal can flip the sense amplifier and cause the result initially stored in the sense amplifier 206-2 to be that of the AND operation using the inverted Row X and true Row Y data values or that of the OR operation using the inverted Row X and true Row Y data values. A true or complement version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 2A can perform a NOT (e.g., invert) operation by putting the non-inverted data value into the dynamic latch of the accumulator and using that data to invert the data value in the sense amplifier 206-2. As previously mentioned, activating the ORinv control signal causes transistor 214-2 to conduct and activating the ANDinv control signal causes transistor 214-1 to conduct. The ORinv and/or ANDinv control signals are used in implementing the NOT function, as described in the pseudocode below:

Copy Row X into the Accumulator;
   Deactivate EQ;
   Open Row X;
   Fire Sense Amps (after which Row X data resides in the sense amps);

Activate LOAD (sense amplifier data (Row X) is transferred to nodes S1 and S2 of the Accumulator and resides there dynamically;

Deactivate LOAD;

Activate ANDinv and ORinv (which puts the complement data value on the data lines);

This results in the data value in the sense amplifier being inverted (e.g., the sense amplifier latch is flipped)

This operation leaves the data in the accumulator unchanged

Deactivate ANDinv and ORinv;

Close Row X;

Precharge;

The "Deactivate EQ," "Open Row X," "Fire Sense Amps," "Activate LOAD," and "Deactivate LOAD" shown in the pseudo code above indicate the same functionality as the same operations in the pseudo code for the "Copy Row X into the Accumulator" initial operation phase described above for the AND operation and OR operation. However, rather than closing the Row X and Precharging after the Row X data is loaded into the sense amplifier 206-2 and copied into the dynamic latch, a complement version of the data value in the dynamic latch of the accumulator can be placed on the data line and thus transferred to the sense amplifier 206-2. This is done by enabling (e.g., causing transistor to conduct) and disabling the invert transistors (e.g., ANDinv and ORinv). This results in the sense amplifier 206-2 being flipped from the true data value that was previously stored in the sense amplifier to a complement data value (e.g., inverted data value) being stored in the sense amp. As such, a true or complement version of the data value in the accumulator can be transferred to the sense amplifier based upon activating or not activating ANDinv and/or ORinv. This operation leaves the data in the accumulator unchanged.

Because the sensing circuitry 250-2 shown in FIG. 2A initially stores the result of the AND, OR, and/or NOT logical operations in the sense amplifier 206-2 (e.g., on the sense amplifier nodes), these logical operation results can be communicated easily and quickly to any enabled row, any row activated after the logical operation is complete, and/or into the secondary latch of the compute component 231-2. The sense amplifier 206-2 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 206-2 fires.

When performing logical operations in this manner, the sense amplifier 206-2 can be pre-seeded with a data value from the dynamic latch of the accumulator to reduce overall current utilized because the sense amps 206-2 are not at full rail voltages (e.g., supply voltage or ground/reference voltage) when accumulator function is copied to the sense amplifier 206-2. An operation sequence with a pre-seeded sense amplifier 206-2 either forces one of the data lines to the reference voltage (leaving the complementary data line at $V_{DD}/2$, or leaves the complementary data lines unchanged. The sense amplifier 206-2 pulls the respective data lines to full rails when the sense amplifier 206-2 fires. Using this sequence of operations will overwrite data in an enabled row.

A SHIFT operation can be accomplished by multiplexing ("muxing") two neighboring data line complementary pairs using a DRAM isolation (ISO) scheme. According to embodiments of the present disclosure, the shift circuitry 223 can be used for shifting data values stored in memory cells coupled by a particular pair of complementary data lines to the sensing circuitry 250-2 (e.g., sense amplifier 206-2) corresponding to a different pair of complementary data lines (e.g., such as a sense amplifier 206-2 corresponding to a left or right adjacent pair of complementary data lines. As used herein, a sense amplifier 206-2 corresponds to the pair of complementary data lines to which the sense amplifier is coupled when isolation transistors 221-1 and 221-2 are conducting. The SHIFT operations (right or left) do not pre-copy the Row X data value into the accumulator. Operations to shift right Row X can be summarized by the following pseudocode follows:

Deactivate Norm and Activate Shift;

Deactivate EQ;

Open Row X;

Fire Sense Amps (after which shifted Row X data resides in the sense amps);

Activate Norm and Deactivate Shift;

Close Row X;

Precharge;

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines). The SHIFT control signal goes high causing isolation transistors 221-3 and 221-4 to conduct, thereby coupling the sense amplifier 206-3 to the left adjacent pair of complementary data lines (e.g., on the memory array side of non-conducting isolation transistors 221-1 and 221-2 for the left adjacent pair of complementary data lines).

After the shift circuitry 223 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 206-3.

In the pseudo code above, "Activate Norm and Deactivate Shift" indicates that a NORM control signal goes high causing isolation transistors 221-1 and 221-2 of the shift circuitry 223 to conduct (e.g., coupling the sense amplifier to the corresponding pair of complementary data lines), and the SHIFT control signal goes low causing isolation transistors 221-3 and 221-4 to not conduct and isolating the sense amplifier 206-3 from the left adjacent pair of complementary data lines (e.g., on the memory array side of non-conducting isolation transistors 221-1 and 221-2 for the left adjacent pair of complementary data lines). Since Row X is still active, the Row X data value that has been shifted right is transferred to Row X of the corresponding pair of complementary data lines through isolation transistors 221-1 and 221-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:
  Activate Norm and Deactivate Shift;
  Deactivate EQ;
  Open Row X;
  Fire Sense Amps (after which Row X data resides in the sense amps);
  Deactivate Norm and Activate Shift;
    Sense amplifier data (shifted left Row X) is transferred to Row X;
  Close Row X;
  Precharge;

In the pseudo code above, "Activate Norm and Deactivate Shift" indicates that a NORM control signal goes high causing isolation transistors 221-1 and 221-2 of the shift circuitry 223 to conduct, and the SHIFT control signal goes low causing isolation transistors 221-3 and 221-4 to not conduct. This configuration couples the sense amplifier 206-2 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudocode for the AND operation and OR operation. After these operations, the Row X data value for the memory cell coupled to the pair of complementary data lines corresponding to the sense circuitry 250-2 is stored in the sense amplifier 206-2.

In the pseudo code above, "Deactivate Norm and Activate Shift" indicates that a NORM control signal goes low causing isolation transistors 221-1 and 221-2 of the shift circuitry 223 to not conduct (e.g., isolate the sense amplifier from the corresponding pair of complementary data lines), and the SHIFT control signal goes high causing isolation transistors 221-3 and 221-4 to conduct coupling the sense amplifier to the left adjacent pair of complementary data lines (e.g., on the memory array side of non-conducting isolation transistors 221-1 and 221-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Figure 7:
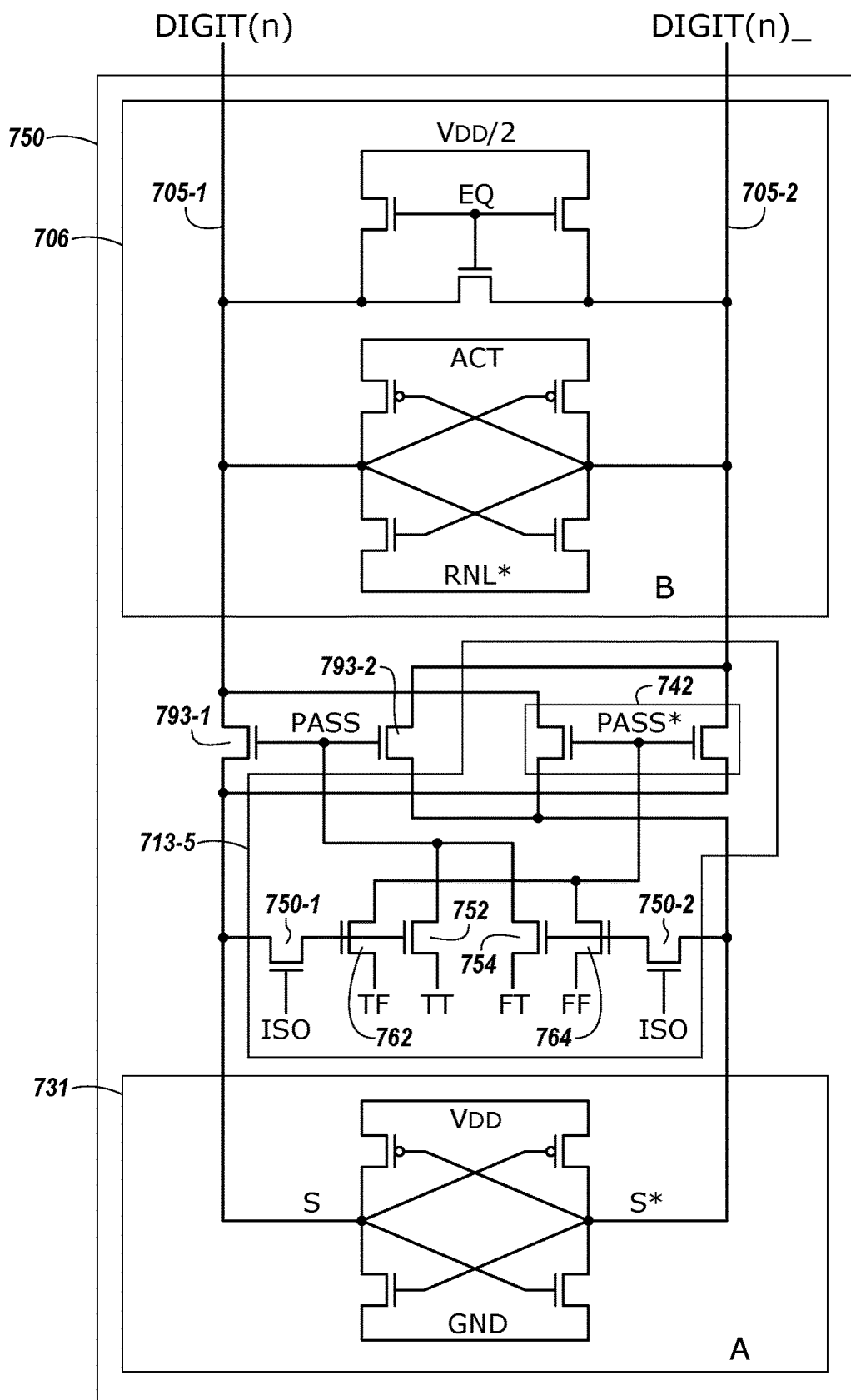
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a sense amplifier 706 coupled to a pair of complementary sense lines 705-1 and 705-2, and a compute component 731 coupled to the sense amplifier 706 via pass gates 707-1 and 707-2. The gates of the pass gates 707-1 and 707-2 can be controlled by a logical operation selection logic signal, PASS, which can be output from logical operation selection logic 713-5. FIG. 9 shows the compute component 731 labeled "A" and the sense amplifier 706 labeled "B" to indicate that the data value stored in the compute component 731 is the "A" data value and the data value stored in the sense amplifier 706 is the "B" data value shown in the logic tables illustrated with respect to FIG. 8.

The sensing circuitry 750 illustrated in FIG. 7 includes logical operation selection logic 713-5. In this example, the logic 713-5 comprises swap gates 742 controlled by a logical operation selection logic signal PASS*. The logical operation selection logic 713-5 also comprises four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line (e.g., 705-1) through isolation transistor 750-1 (having a gate coupled to an ISO signal control line), and gates of logic selection transistors 764 and 754 are coupled to the complementary sense line (e.g., 705-2) through isolation transistor 750-2 (also having a gate coupled to an ISO signal control line).

Logic selection transistors 752 and 754 are arranged similarly to transistor 207-1 (coupled to an AND signal control line) and transistor 207-2 (coupled to an OR signal control line) respectively, as shown in FIG. 2A. Operation of logic selection transistors 752 and 754 are similar based on the state of the TT and FT selection signals and the data values on the respective complementary sense lines at the time the ISO signal is asserted. Logic selection transistors 762 and 764 also operate in a similar manner to control continuity of the swap transistors 742. For instance, to OPEN (e.g., turn on) the swap transistors 742, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 742 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 7 are summarized in the logic table illustrated in FIG. 8.

FIG. 8 is a logic table illustrating selectable logic operation results implementable by the sensing circuitry shown in FIG. 7 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 706 and compute component 731. The four control signals, in conjunction with a particular data value present on the complementary sense lines, controls the continuity of the pass gates 707-1 and 707-2 and swap transistors 742, which in turn affects the data value in the compute component 731 and/or sense amplifier 706 before/after firing. The capability to selectably control continuity of the swap transistors 742 facilitates implementing logical operations involving inverse data values (e.g., inverse operands and/or inverse result), among others.

The logic table illustrated in FIG. 8 shows the starting data value stored in the compute component 731 shown in column A at 844, and the starting data value stored in the sense amplifier 706 shown in column B at 845. The other 3 top column headings (NOT OPEN, OPEN TRUE, and OPEN INVERT) in the logic table of FIG. 8 refer to the continuity of the pass gates 707-1 and 707-2, and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "Not Open" column 856 corresponds to the pass gates 707-1 and 707-2 and the swap transistors 742 both being in a non-conducting condition, the "Open True" 870 corresponds to the pass gates 707-1 and 707-2 being in a conducting condition, and the "Open Invert" 871 corresponds to the swap transistors 742 being in a conducting condition. The configuration corresponding to the pass gates 707-1 and 707-2 and the swap transistors 742 both being in a conducting condition is not reflected in the logic table of FIG. 8 since this results in the sense lines being shorted together.

Via selective control of the continuity of the pass gates 707-1 and 707-2 and the swap transistors 742, each of the three columns of the first set of two rows of the upper portion of the logic table of FIG. 8 can be combined with each of the three columns of the second set of two rows below the first set to provide 3×3=9 different result combinations, corresponding to nine different logical operations, as indicated by the various connecting paths shown at 875. The nine different selectable logical operations that can be implemented by the sensing circuitry 750 are summarized in the logic table illustrated in FIG. 8.

The columns of the lower portion of the logic table illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

As such, the sensing circuitry shown in FIG. 7 can be used to perform various logical operations as shown in FIG. 8. For example, the sensing circuitry 750 can be operated to perform various logical operations (e.g., AND and OR logical operations) in association with comparing data patterns in memory in accordance with a number of embodiments of the present disclosure.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. A potential advantage of the apparatuses and methods described herein may not be realized in terms of single instruction speed, but rather the cumulative speed that can be achieved by an entire bank of data being computed in parallel without necessarily transferring data out of the memory array (e.g., DRAM) or firing a column decode. For instance, data transfer time can be reduced or eliminated. As an example, apparatuses of the present disclosure can perform ANDs, ORs, or SHIFTs in parallel (e.g., concurrently), using data values in memory cells coupled to a data line (e.g., a column of 16K memory cells).

A signed division operation can be performed in parallel without transferring data out of the array via an I/O line. Further, previous approaches included sensing circuits where data is moved out for logical operation processing (e.g., using 32 or 64 bit registers) and included fewer operations being performed in parallel compared to the apparatus of the present disclosure. In this manner, significantly higher throughput is effectively provided along with more efficient use of avoiding transferring data out of the array by insuring the data is stored in such a way to perform operations on the data in parallel. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a host; and
   a memory device coupled to the host and configured to:
   receive, from the host, an instruction to perform a signed division operation;
   execute the instruction by operating sensing circuitry comprising a sense amplifier and a compute component to divide a signed dividend element stored in an array of the memory device by a signed divisor element stored in the array;
   wherein the signed dividend element is stored in a first group of memory cells of the array, and wherein the first group of memory cells are commonly coupled to a same sense line and to a first plurality of access lines of the array; and provide a result of the signed division operation to the host.

2. The system of claim 1, wherein the signed divisor element is stored in a second group of memory cells of the array, and wherein the second group of memory cells are commonly coupled to the same sense line and to a second plurality of access lines of the array.

3. The system of claim 1, wherein the host comprises a number of processors.

4. The system of claim 3, wherein the number of processors are external to the memory device and coupled thereto via a bus.

5. The system of claim 1, wherein the memory device is a processor-in-memory device.

6. The system of claim 1, wherein the memory device is configured to perform logical operations using the sense amplifier and compute component to perform the signed division operation without transferring data to a storage location external to the array and the sensing circuitry.

7. A system, comprising:
a host configured to generate instructions; and
a memory device comprising:
an array of memory cells coupled to sensing circuitry comprising a plurality of sense amplifiers and corresponding compute components coupled to respective columns of the array; and
control circuitry configured to execute instructions from the host to perform, in parallel, a plurality of signed division operations on a respective plurality of signed dividend elements and corresponding signed divisor elements stored in the array;
wherein the plurality of signed division operations are performed without transferring the signed dividend elements and the signed divisor elements to the host;
wherein the plurality of signed dividend elements are stored in memory cells of the array corresponding to different respective columns; and
wherein the corresponding plurality of signed divisor elements are stored in memory cells of the array corresponding to the different respective columns such that each one of the signed dividend elements and its corresponding divisor elements are stored in memory cells coupled to a same column of the array.

8. The system of claim 7, wherein the plurality of signed dividend elements and corresponding signed divisor elements are stored in the array as bit-vectors.

9. The system of claim 7, wherein the control circuitry is configured to perform the plurality of signed division operations by using the sense amplifiers and corresponding compute components to perform logical operations on operands stored in the array without transferring data external to the sensing circuitry and the array.

10. The system of claim 9, wherein the host is configured to perform logical operations in addition to logical operations performed via using the sensing circuitry.

11. The system of claim 7, wherein the control circuitry comprises a sequencer.

12. The system of claim 7, wherein the control circuitry comprises a state machine.

13. The system of claim 7, wherein the memory device is configured to provide results of the plurality of signed division operations to the host.

14. The system of claim 7, wherein the system comprises a server.

15. The system of claim 7, wherein the host comprises a processing resource configured to generate the instructions.

16. The system of claim 7, wherein the host and the memory device are located on a same integrated circuit.

17. A method, comprising:
receiving, from a host, an instruction to perform a signed division operation between a signed dividend element and a signed divisor element stored in memory cells corresponding to a same column of an array; and
executing the instruction on a memory device comprising the array by using control circuitry configured to operate sensing circuitry comprising a sense amplifier and a compute component coupled to a sense line corresponding to the column of the array;
wherein a result of the signed division operation is determined without transferring data to the host.

18. The method of claim 17, wherein performing the signed division operation further comprises:
operating the sense amplifier and the compute component to perform a plurality of logical operations; and
storing a quotient element and a remainder element in memory cells corresponding to the same column of the array.

19. The method of claim 17, wherein the host comprises a processor coupled to the memory device via a bus, and wherein the method includes providing the result to the processor.

* * * * *